United States Patent [19]
Aoshima et al.

[11] Patent Number: 5,346,975
[45] Date of Patent: Sep. 13, 1994

[54] LIGHT-SENSITIVE COMPOSITION

[75] Inventors: Keitaro Aoshima; Hideo Miyake, both of Shizuoka, Japan

[73] Assignee: Fuji Photo Film Co., Ltd., Minami-Ashigara, Japan

[21] Appl. No.: 945,388

[22] Filed: Sep. 16, 1992

[30] Foreign Application Priority Data

Sep. 20, 1991 [JP] Japan .................................. 3-242027
Sep. 20, 1991 [JP] Japan .................................. 3-242097

[51] Int. Cl.$^5$ .................. C08F 226/06; C08F 230/02; C08F 228/02; C08F 218/02; C08F 265/06
[52] U.S. Cl. ..................................... 526/263; 526/277; 526/287; 526/288; 526/307.7; 525/309
[58] Field of Search ............... 526/263, 277, 287, 288, 526/307.7

[56] References Cited

U.S. PATENT DOCUMENTS 4,079,041  3/1978  Baumann et al. ................... 526/263
4,297,470  10/1981  Osada et al. .

Primary Examiner—Joseph L. Schofer
Assistant Examiner—Wu C. Cheng
Attorney, Agent, or Firm—Burns, Doane, Swecker & Mathis

[57] ABSTRACT

The present invention provides a light-sensitive composition comprising specific photo-crosslinkable polymer compounds.

The light-sensitive composition of the present invention exhibits excellent wear resistance when it is photo-hardened, and hence it can give lithographic printing plates capable of producing a lot of printed matter in good quality when it is used for presensitized plates for use in making lithographic printing plates.

20 Claims, No Drawings

LIGHT-SENSITIVE COMPOSITION

BACKGROUND OF THE INVENTION

1. Field of the Invention

The present invention relates to a light-sensitive composition suitable for producing a presensitized plate for use in making lithographic printing plates (hereinafter referred to as "PS plate(s)"), IC circuits, photomasks or the like and more particularly it relates to a negative working light-sensitive composition comprising a photo-crosslinkable polymer compound, which exhibits excellent wear resistance when it is photo-hardened.

2. Prior Art

Photo-crosslinkable materials which crosslink through addition cyclization reaction are well known and widely used as a main component of a light-sensitive composition, which is used for, for example, the manufacture of PS plates. Useful examples of such kind of photo-crosslinkable compounds include polymer compounds having maleimido groups in their side chains and polymer compounds having photodimerizable unsaturated double bonds adjacent to aromatic rings such as those having cinnamyl groups, cinnamylidene groups, chalcone groups and the like.

Negative working PS plates using those photo-crosslinkable polymer compounds can be classified into two types, i.e., the alkali-developable type PS plates whose unexposed potions are removed (or developed) with an aqueous alkaline developer and the solvent-developable type PS plates whose unexposed portions are removed (or developed) with an organic solvent type developer, and to which type PS plates belong depends on the properties of the photo-crosslinkable polymer compounds used therein. Recently, the former type has become of major interest from the viewpoint of safety in operation and health of operators.

As the method for making the photo-crosslinkable polymer compounds alkali-soluble, there have been known a method where the polymer compounds are prepared by copolymerizing low-molecular-weight-compounds having photo-crosslinkable groups and polymerizable unsaturated bonds with methacrylic acid or acrylic acid such as disclosed in Japanese Patent Unexamined Publication (hereinafter referred to as "J.P. KOKAI") No. 52-988 (=U.S. Pat. No. 4,079,041) and Japanese Patent Publication for Opposition Purpose (hereinafter referred to as "J.P. KOKOKU") No. Sho 49-28122 (=U.S. Pat. No. 4,297,470), a method where the polymer compounds are prepared by copolymerizing low-molecular-weight-compounds having photo-crosslinkable groups and polymerizable unsaturated bonds with maleic anhydride and hydrolyzing the resulted compounds such as disclosed in J.P. KOKOKU No. Sho 57-56485, a method where polymeric carboxylic acids are prepared from polymer compounds containing carboxylic acid anhydride moieties while introducing photo-crosslinkable groups thereinto through polymer reaction such as disclosed in J.P. KOKAI No. Sho 59-218440, a method where photo-crosslinkable groups are introduced into polyacrylic acids through polymer reaction such as disclosed in J.P. KOKAI No. Sho 48-74594 and the like.

However, light-sensitive compositions comprising photo-crosslinkable polymer compounds described above have a drawback that they have poor wear resistance when they are photo-hardened and hence they cannot exhibit sufficient printing durability when they are used in lithographic printing plates.

SUMMARY OF THE INVENTION

Therefore, the object of the present invention is to provide a negative working light-sensitive composition comprising a photo-crosslinkable polymer compound, which exhibits excellent wear resistance when photo-hardened and can provide lithographic printing plates having high printing durability when used in light-sensitive layers of PS plates.

We have conducted various studies to achieve the foregoing object of this invention and have found that the object can effectively be achieved by a novel light-sensitive composition comprising a specific polymer compound.

According to the present invention, there is provided a light-sensitive composition comprising a photo-crosslinkable polymer compound wherein the photo-crosslinkable polymer compound comprises structural units represented by the following formula (I) in an amount of not less than 1% by weight on the basis of the total weight of the photo-crosslinkable polymer compound;

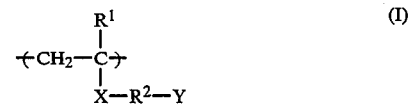

wherein $R^1$ represents hydrogen atom or methyl group; X represents a single bond, an ester bond or an amide bond; $R^2$ represents a single bond or a divalent bridging group composed of two or more kinds of atoms selected from the group consisting of C, H, N, O and S; and Y represents a polymer group having a weight average molecular weight of not less than 500 and comprising structural units represented by the following formula (II) in an amount of not less than 5% by weight on the basis of the total weight of the group Y;

where $R^3$ represents hydrogen atom or methyl group; $R^4$ represents a single bond or a divalent bridging group composed of two or more kinds of atoms selected from the group consisting of C, H, N, O and S; and Z represents a functional group represented by the following formula (III) or (IV);

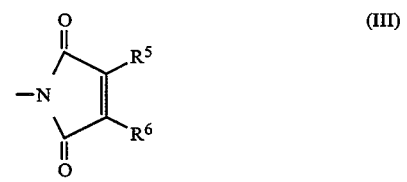

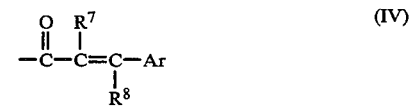

where $R^5$ and $R^6$ independently represent hydrogen atom, a halogen atom or an alkyl group having 1 to 12 carbon atoms, $R^5$ and $R^6$ may combine to form a 5- or 6-membered cyclic ring; $R^7$ and $R^8$ independently represent hydrogen atom, a halogen atom, cyano group, nitro group or an alkyl group having 1 to 12 carbon atoms; and Ar represents an optionally substituted aromatic or heteroaromatic group having 1 to 12 carbon atoms.

The present invention further provides a light-sensitive composition comprising a photo-crosslinkable polymer compound wherein the photo-crosslinkable polymer compound comprises structural units represented by the following formula (VII);

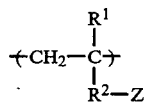

wherein $R^1$ represents hydrogen atom or methyl group; $R^2$ represents a single bond or a divalent bridging group composed of two or more kinds of atoms selected from the group consisting of C, H, N, O and S; and Z represents a functional group of the following formula (III) or (IV);

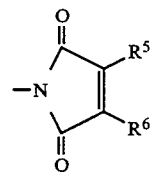

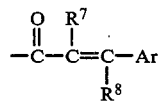

where $R^5$ and $R^6$ independently represent hydrogen atom, a halogen atom or an alkyl group having 1 to 12 carbon atoms, $R^5$ and $R^6$ may combine to form a 5- or 6-membered cyclic ring; $R^7$ and $R^8$ independently represent hydrogen atom, a halogen atom, cyano group, nitro group or an alkyl group having 1 to 12 carbon atoms; and Ar represents an optionally substituted aromatic or heteroaromatic group having 1 to 12 carbon atoms; and structural units represented by the following formula (VIII)

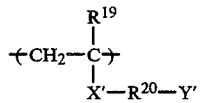

wherein $R^{19}$ represents hydrogen atom or methyl group; $X'$ represents a single bond, an ester bond or an amide bond; $R^{20}$ represents a single bond or a divalent bridging group composed of two or more kinds of atoms selected from the group consisting of C, H, N, O and S; $Y'$ represents a polymer group having a weight average molecular weight of not less than 500 and comprising structural units represented by the following formula (IX) in an amount of not less than 5% by weight on the basis of the total weight of the group $Y'$.

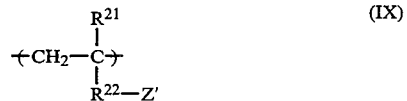

where $R^{21}$ represents hydrogen atom or methyl group; $R^{22}$ represents a single bond or a divalent bridging group composed of two or more kinds of atoms selected from the group consisting of C, H, N, O and S; and $Z'$ represents —COOH, —OPO(OH) ($OR^{15}$), —PO(OH) ($OR^{16}$), —SO$_3$H or —CONHSO$_2R^{17}$, where $R^{15}$ and $R^{16}$ independently represent hydrogen atom or an optionally substituted alkyl group having 1 to 15 carbon atoms; and $R^{17}$ represents an optionally substituted hydrocarbon group having 1 to 15 carbon atoms.

DETAILED DESCRIPTION OF THE INVENTION

The photo-crosslinkable polymer compound comprising the units of the formula (I) used in the present invention is obtained by radical (co)polymerization of macromers (macromolecular monomers) represented by the following formula (V);

In the formula (V), $R^1$, $R^2$, X and Y have the same meanings defined above.

The macromer of the present invention may be prepared by a conventional method. For example, it may be prepared by the radical polymerization method, that is, it may be prepared by reacting oligomers having a terminal reactive group, which is obtained by radical polymerization using a polymerization initiator and/or chain transfer agent containing reactive groups such as carboxyl, halogenoacyl, hydroxyl, amino, halogeno and epoxy groups, with various compounds.

More specifically, the macromer can be prepared in accordance with the methods described in P. Dreyfuss & R. P. Quirk, Encycl. Polym. Sci. Eng., Vol. 7, 551 (1987); P. F. Rempp, & E. Franta, Adv. Polym. Sci., Vol. 58, 1 (1984); Y. Kawakami, Kagaku Kogyo (Chemical Industry), Vol. 38, 56 (1987); Y. Yamashita, Kobunsi (Macromolecule), Vol. 31, 988 (1982); S. Kobayashi, Kobunshi (Macromolecule), Vol. 30, 625 (1981); K. Ito, Kobunshi Kako (Processing of Polymer Material), Vol. 35, 262 (1986) and T. Azuma & T. Tsuda, Kino Zairyo (Functional Material), 10, 5 (1987) and the literature and the patent documents cited therein, of which disclosures are totally incorporated herein by reference. Preferred examples of the chain transfer agent used in the synthesis of the macromer include mercapto compounds having the above-mentioned reactive group such as thioglycolic acid, thiomalic acid, thiosalicylic acid, 2-mercaptpropionic acid, 3-mercaptopropionic acid, 3-mercaptobutyric acid, N-(2-mercaptopropyonyl)glycine, 2-mercaptonicotinic acid, 3-[N-(2-mercaptoethyl)carbamoyl]propionic acid, 3-[N-(2-mercaptoethyl) amino]propionic acid, N-(3-mercaptopropionyl)alanine, 2-mercaptoethanesulfonic acid, 3-mercaptopropanesulfonic acid, 4-mercaptobutanesulfonic acid, 2-mercaptoethanol, 3-mercapto-1,2-propanediol, 1-mercapto-2-propanol, 3-mercapto-2- butanol, mercaptophenol, 2-mercaptoethylamine, 2-mercaptoimidazole and 2-mercapto-3-pyridinol, disulfide compounds which are the oxidized compounds of the foregoing mercapto compounds and iodinated alkyl compounds such as iodoacetic acid, iodopropionic acid, 2-iodoethanol, 2-iodoethanesulfonic acid and 3-iodo-propanesulfonic acid. Among those compounds, particularly preferred are the mercapto compounds.

Preferred examples of the polymerization initiator having the specific reactive group include 2,2'-azobis(2-cyanopropanol), 2,2'-azobis(2-cyanopentanol), 4,4'-azobis(4-cyanovaleric acid), 4,4'-azobis(4-cyanovaleric acid chloride), 2,2'-azobis[2-(5-methyl-2-imidazoline-2-yl)propane], 2,2'-azobis[2-(2-imidazoline-2-yl)propane], 2,2'-azobis[2-(3,4,5,6-tetrahydropyrimidine-2-yl)propane], 2,2'-azobis {2-[1-(2-hydroxyethyl)-2-imidazoline-2-yl]propane}, 2,2'-azobis[2-methyl-N-(2-hydroxyethyl)-propionamide] and the derivatives thereof.

These chain transfer agents and the polymerization initiators are used in an amount of 0.1 to 15% by weight, preferably 0.5 to 10% by weight of the total weight of the monomers.

Preferred examples of the polymerizable monomer used for the preparation of the macromers of the formula (V) are those monomers represented by the following general formula (VI);

$$CH_2=\overset{R^3}{\underset{R^4-Z}{C}} \qquad (VI)$$

wherein $R^3$, $R^4$ and $Z$ have the same meanings as defined above.

Those compounds of the formula (VI) are disclosed in various patent documents such as U.S. Pat. Nos. 4,297,470 and 4,079,041, J.P. KOKOKU Nos. Sho 55-12042 and Sho 51-37637, J.P. KOKAI Nos. Sho 50-24384, Sho 62-284350 and Sho 51-125474.

Among those, particularly preferred compounds for the present invention are the following compounds.

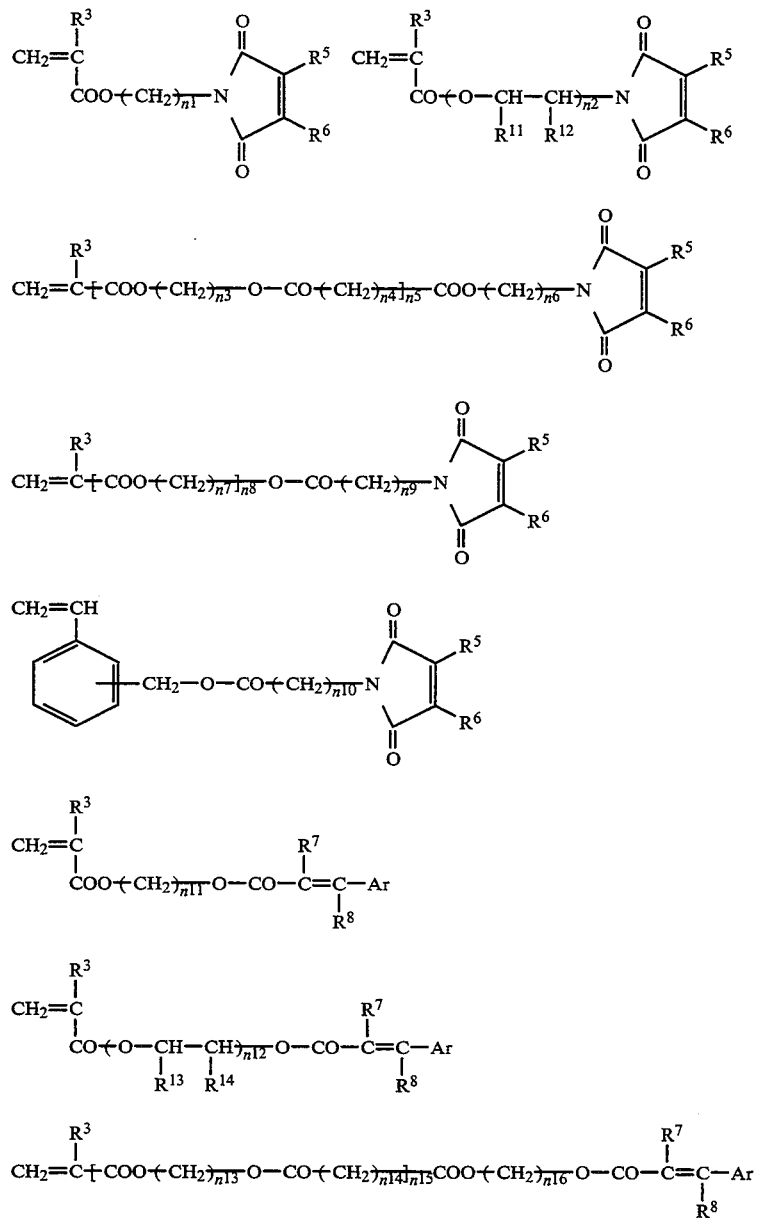

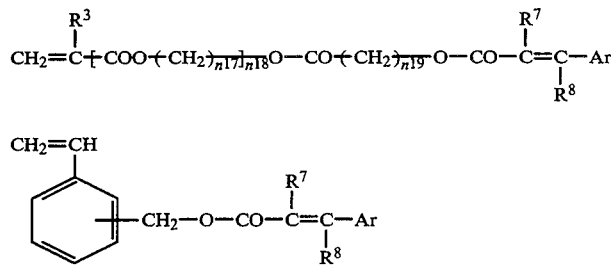

In the above formulae, $R^3$, $R^5$, $R^6$, $R^7$, $R^8$ and Ar have the same meanings as defined above. $R^5$ and $R^6$ preferably represent a halogen atom or an alkyl group having 1 to 4 carbon atoms, more preferably methyl groups; $R^7$ and $R^8$ preferably represent hydrogen atoms; and Ar preferably represents an optionally substituted phenyl group. $R^{11}$, $R^{12}$, $R^{13}$ and $R^{14}$ independently represent hydrogen atom or methyl group; and each of $n^1$ to $n^{19}$ represents an natural number, preferably a natural number of from 1 to 12.

Though the structural unit of the formula (I) may totally be composed of one kind of the unit of the formula (II), it may contain two or more kinds of the unit of the formula (II). In such a case, the macromer can be prepared by using two or more kinds of the monomers of the formula (VI).

Further, the structural unit of the formula (I) may contain structural units other than those of the formula (II). In such a case, the macromer can be prepared by using the monomers of the formula (VI) and other polymerizable monomers.

Examples of such polymerizable monomers include compounds having polymerizable unsaturated bond such as those selected from the group consisting of acrylates, acrylamides, methacrylates, methacrylamides, allyl compounds, vinyl ethers, vinyl esters, styrenes and crotonates. More specifically, there may be mentioned such acrylates as alkyl (preferred carbon atoms thereof ranges from 1 to 10) acrylates, for instance, methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate, and aryl acrylates, for instance, phenyl acrylate; such methacrylates as alkyl (preferred carbon atom number thereof ranges from 1 to 10) methacrylates, for instance, methyl methacrylate, ethyl methacrylate, propyl methacrylate, iso-propyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate, and aryl methacrylates, for instance, phenyl methacrylate, cresyl methacrylate and naphthyl methacrylate; such acrylamides as acrylamide, N-alkylacrylamides (the alkyl group thereof are those having 1 to 10 carbon atoms, such as methyl, ethyl, propyl, butyl, t-butyl, heptyl, octyl, cyclohexyl, hydroxyethyl and benzyl), N-arylacrylamides (examples of the aryl groups include phenyl, tolyl, nitrophenyl, naphthyl, hydroxyphenyl and sulfamoylphenyl), N,N-dialkylacrylamides (examples of the alkyl group are those having 1 to 10 carbon atoms, for instance, methyl, ethyl, butyl, isobutyl, ethylhexyl and cyclohexyl), N,N-diarylacrylamides (examples of the aryl groups include phenyl), N-methyl-N-phenylacrylamide, N-hydroxyethyl-N-methylacrylamide and N-(2-acetamido)-ethyl-N-acetyl acrylamide; such methacrylamides as methacrylamide, N-alkylmethacrylamides (examples of the alkyl group thereof are those having 1 to 10 carbon atoms such as methyl, ethyl, t-butyl, ethylhexyl, hydroxyethyl and cyclohexyl), N-arylmethacrylamides (examples of aryl group thereof include phenyl, hydroxyphenyl and sulfamoylphenyl), N,N-dialkylmethacrylamides (examples of the alkyl group include ethyl, propyl and butyl), N,N-diarylmethacrylamides (examples of aryl group thereof include phenyl), N-hydroxyethyl-N-methylmethacrylamide, N-methyl-N-phenylmethacrylamide and N-ethyl-N-phenylmethacrylamide; such allyl compounds as allyl esters, for instance, allyl acetate, allyl caproate, allyl caprylate, allyl laurate, allyl palmitate, allyl stearate, allyl benzoate, allyl acetoacetate and allyl lactate, and allyloxyethanol; such vinyl ethers as alkyl vinyl ethers, for instance, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether; vinyl aryl ethers, for instance, vinyl phenyl ether, vinyl tolyl ether, vinyl chlorophenyl ether, vinyl 2,4-dichlorophenyl ether, vinyl naphthyl ether and vinyl anthranyl ether; such vinyl esters as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutylate, vinyl cyclohexylcarboxylate, vinyl benzoate, vinyl salicylate, vinyl chlorobenzoate, vinyl tetrachlorobenzoate and vinyl naphthoate; such styrenes as styrene, alkyl styrenes, for instance, methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene and acetoxymethyl styrene, alkoxy styrenes, for instance, methoxy styrene, 4-methoxy-3-methyl styrene and dimethoxy styrene, halogenostyrenes, for instance, chlorostyrene, dichlorostyrene, trichloro-styrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene; such crotonates as alkyl crotonates, for instance, butyl crotonate, hexyl crotonate and glycerin monocrotonate; such dialkyl itaconates as dimethyl itaconate, diethyl itaconate and dibutyl itaconate; such dialkyl maleates or fumarates as dimethyl maleate and dibutyl fumarate; acrylonitrile and methacrylonitrile.

Among these polymerizable monomers, preferably used are acrylates, methacrylates, acrylamides, methacrylamides, acrylonitrile and methacrylonitrile. The group Y in the formula (I) preferably consists of 5 to 100% by weight, more preferably 20 to 100% by weight of the structural units of the formula (II).

The polymer compounds comprising the units of the formula (I) may obtain by radical copolymerization of the macromers of the formula (V) and other polymerizable monomers. In this respect, the polymerizable monomers are preferably selected from those having one or more of acid groups selected from the group consisting of —COOH, —OPO(OH)(OR$^{15}$), —PO(OH)(OR$^{16}$), —SO$_3$H or —CONHSO$_2$R$^{17}$, where R$^{15}$ and R$^{16}$ independently represent hydrogen atom or an optionally substituted alkyl group having 1 to 15 carbon atoms; and R$^{17}$ represents an optionally substituted hydrocarbon group having 1 to 15 carbon atoms, in order to obtain good developability of the composition.

Preferred examples of the polymerizable monomers containing the above acid groups are following compounds.

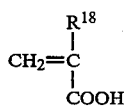

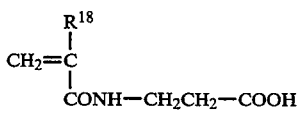

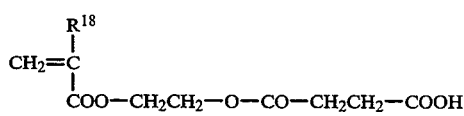

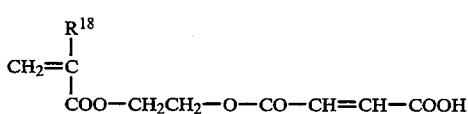

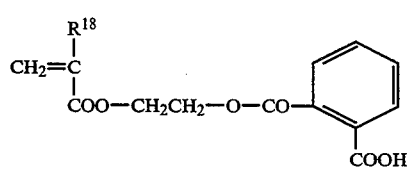

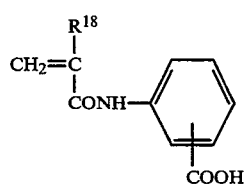

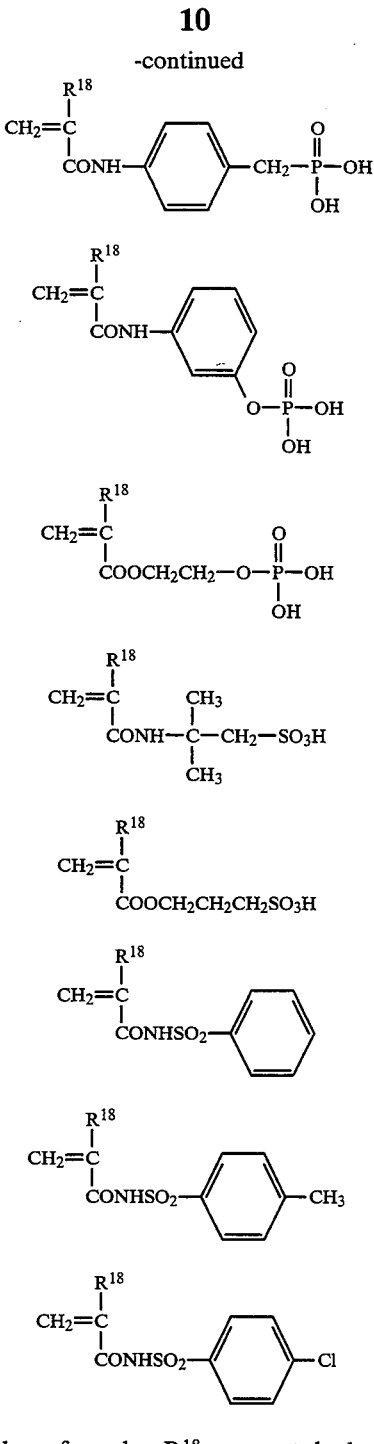

In the above formulae, R$^{18}$ represents hydrogen atom or methyl group.

Further, the polymer compound containing the unit of formula (I) may be prepared by using polymerizable monomers other than the monomers of the formula (V) and the polymerizable monomers having the acid groups.

Examples of such polymerizable monomers include the foregoing acrylates, methacrylates, acrylamides, methacrylamides, allyl compounds, vinyl ethers, vinyl esters, styrenes, crotonates and the compounds of the formula (VI).

Among these polymerizable monomers, preferably used are acrylates, methacrylates, acrylamides, methacrylamides, acrylonitrile, methacrylonitrile and the compounds of the formula (VI).

The macromer of the formula (V), the polymerizable monomer having the acid groups and the other polymerizable monomer may respectively be used alone or in any combination.

The obtained polymer compound comprising the units of the formula (I) comprises at least 1%, preferably 5 to 80% by weight of the structural units of the formula (I).

Further, the polymer compound comprising the units of the formula (I) preferably comprises at least 1%, more preferably 5 to 50% by weight of the structural units derived from the polymerizable monomers having the acid groups.

In the polymer compounds comprising the units of the formula (I), their backbones and the group Y in the formula (II) may be block copolymers or random copolymers.

The weight average molecular weight of the macromers used for the preparation of the polymer compounds comprising the units of the formula (I) is preferably not less than 500 and more preferably ranges from 700 to 200,000. With respect to the polymer compounds comprising the units of the formula (I), the average molecular weight is preferably not less than 2,000 and more preferably ranges from 5,000 to 300,000, the number average molecular weight is not less than 800 and more preferably ranges from 1,000 to 250,000 and the polydispersity (weight average molecular weight/number average molecular weight) is preferably not less than 1 and more preferably ranges from 1.1 to 10.

The polymer compounds comprising the units of the formula (I) may contain unreacted monomers and macromers. In such a case, it is preferred that the polymer binders contain not more than 15% by weight of the unreacted compounds.

The photo-crosslinkable polymer compound comprising the units of the formulae (VII) and (VIII) is preferably obtained by radical copolymerization of monomers of the following formula (X) and macromers of the following formula (XI);

(X)

(XI)

In the formulae (X) and (XI), $R^1$, $R^2$, Z, $R^{19}$, $R^{20}$, X' and Y' have the same meanings as defined above.

As examples of the monomer compound of the formula (X), there can be mentioned the same compounds as those mentioned hereinbefore as examples of the compounds of the formula (VI), and the preferred compounds of the formula (VI) may be preferably used as the compound of the formula (X).

The macromers of the formula (XI) may be prepared by a conventional method and they may be prepared in the same manner as used in the preparation of the macromers of the formula (V).

The macromers of the formula (XI) contain acidic groups in the repeating units represented by the general formula (IX). Therefore, the macromers are prepared, for instance, in accordance with the following Reaction Scheme (1). In Reaction Scheme (1), monomers having the acidic groups protected by suitable protective groups are polymerized through radical polymerization by the methods mentioned above to prepare the macromer having the terminal reactive group.

Reaction scheme (1):

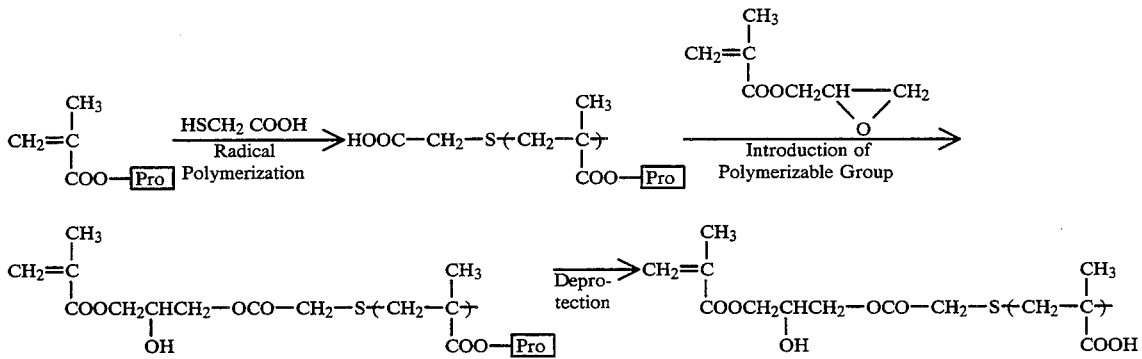

The symbol of

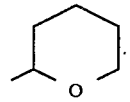

represents a protective group of —COOH such as —C(C₆H₅)₃, —Si(CH₃)₂(t—C₄H₉) and

The introduction reaction of the protective groups and the deprotection reaction such as hydrolysis, hydrogenolysis and oxidative degradation reactions for the acidic groups contained in the macromers of the invention may be carried out by conventional methods. For example, they may be carried out by the methods described in J. F. W. McOmie, Protective Groups in Organic Chemistry, Plenum Press (1973); T. W. Greene, Protective Groups in Organic Synthesis, John Wiley & Sons (1981); R. Oda, Kobunsi Fine Chemical (Macromolecular Fine Chemical), Kodansha (1976); Y. Iwakura, K. Kurita, Hannosei Kobunshi (Reactive Macromolecule), Kodansha (1977); G. Berner et al, J. Radiation Curing, No. 10, 10 (1986); J.P. KOKAI Nos. Sho 62-212669 (=Brit. Pat. No. 2189892), Sho 62-286064, Sho 62-210475 (=U.S. Pat. No. 4,929,526), Sho 62-195684 (=U.S. Pat. No. 4,929,526), Sho 62-258476 (=U.S. Pat. No. 4,828,952), Sho 63-260439, Hei 1-70767; and U.S. Pat. No. 4,910,112, of which disclosures are totally incorporated herein by reference.

The macromer may also be prepared in accordance with the following Reaction Scheme (2), wherein an oligomer, which is prepared in the same manner as described above and has a specific reactive group at one terminal thereof, is reacted with a compound having a polymerizable double bond. The compound having a polymerizable double bond is reactive only to the specific reactive group contained in the oligomer because of the difference of reactivity between the specific reactive group and the acidic group contained in the oligomer.

Reaction Scheme (2)

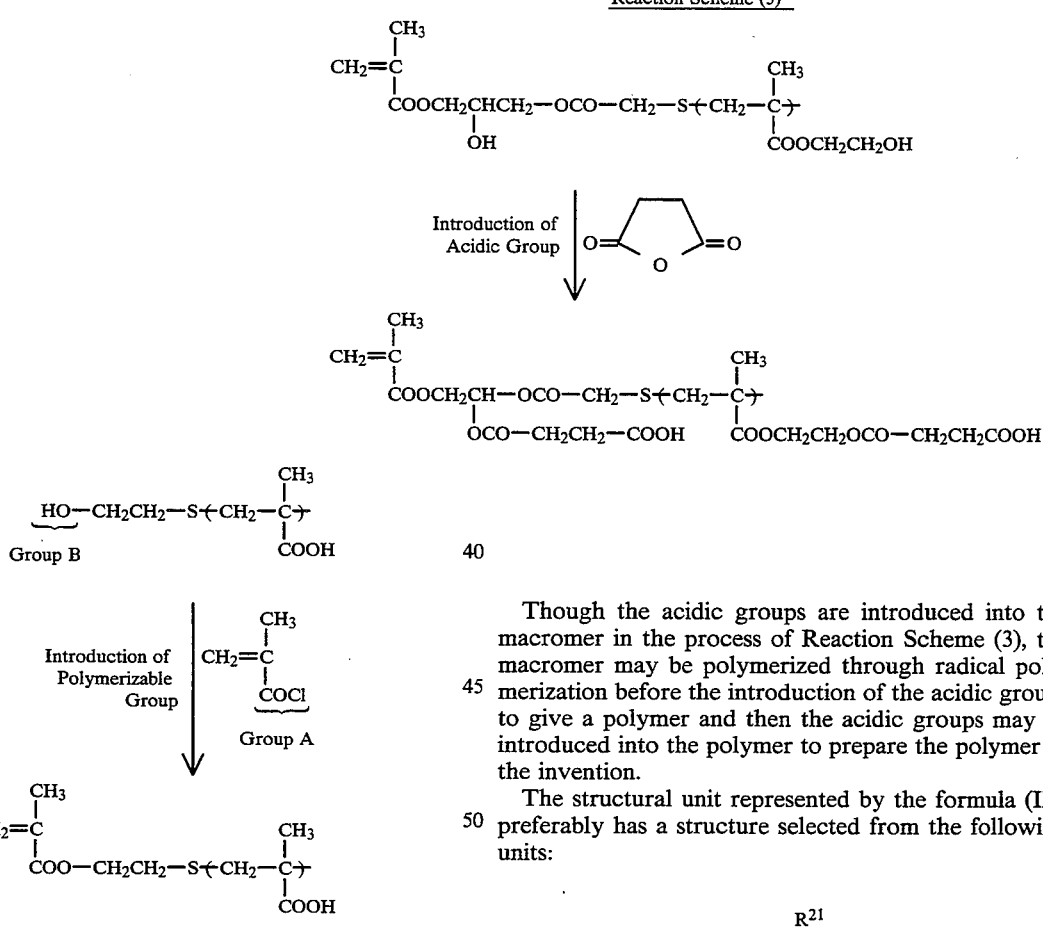

The combination of the reactive functional groups A and B, which are —COCl and —OH in Reaction Scheme (2) described above, may be selected from those mentioned in Table A below. However, the present invention is not limited thereto, and any combination of the functional groups may be used so long as the macromer can be prepared without protecting the acidic groups contained in the macromer by utilizing the reactional selectivity under normal conditions of organic reaction.

TABLE A

| Functional group A | Functional group B |
|---|---|
| —COCl, acid anhydride, | —OH, —NHR$^{23}$ |

TABLE A-continued

| Functional group A | Functional group B |
|---|---|
| —SO$_2$Cl | |
| —COOH, —NHR$^{23}$ | Halogeno group |
| —OH, —NHR$^{23}$ | —COCl, —SO$_2$Cl |

In the above Table A, R$^{23}$ is hydrogen atom or an optionally substituted hydrocarbon group having 1 to 15 carbon atoms and preferably a hydrogen atom.

The macromer may further be prepared in accordance with the following Reaction Scheme (3), wherein a macromer having functional groups which may be substituted by the acidic groups, for example, hydroxyl groups, is prepared by the method described above and then the acidic groups are introduced into the macromer.

Though the acidic groups are introduced into the macromer in the process of Reaction Scheme (3), the macromer may be polymerized through radical polymerization before the introduction of the acidic groups to give a polymer and then the acidic groups may be introduced into the polymer to prepare the polymer of the invention.

The structural unit represented by the formula (IX) preferably has a structure selected from the following units:

$$\begin{array}{c} R^{21} \\ | \\ {+}CH_2{-}C{\rightarrow} \\ | \\ COOH \end{array}$$

$$\begin{array}{c} R^{21} \\ | \\ {+}CH_2{-}C{\rightarrow} \\ | \\ CO{-}G{-}R^{24}{-}COOH \end{array}$$

$$\begin{array}{c} R^{21} \\ | \\ {+}CH_2{-}C{\rightarrow} \qquad O \\ | \qquad \qquad \| \\ CO{-}G{-}R^{24}{-}O{-}P{-}OH \\ | \\ OH \end{array}$$

-continued

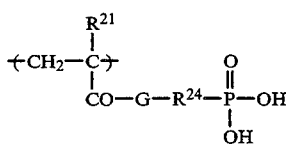

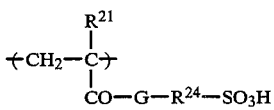

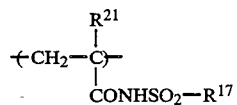

In the above formulae, $R^{21}$ and $R^{17}$ has the same meanings as defined above; G represents —O— or —NH—; $R^{24}$ represents an optionally substituted hydrocarbon bridging group having 1 to 15 carbon atoms. Preferred examples of the unit include the following units;

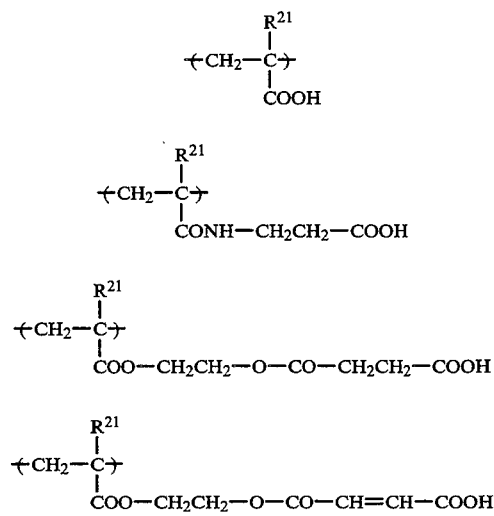

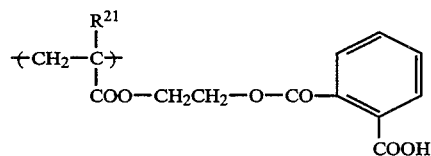

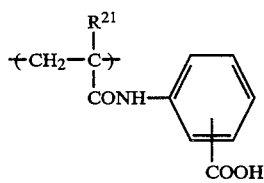

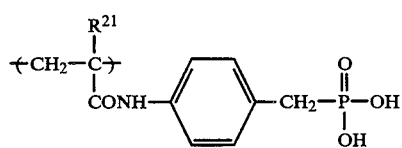

-continued

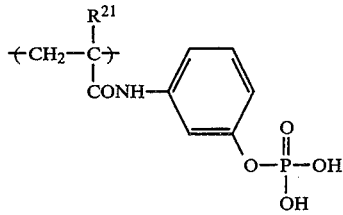

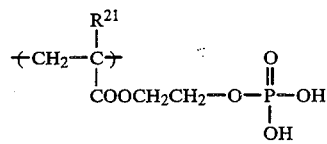

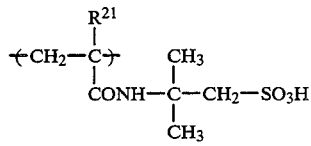

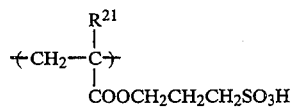

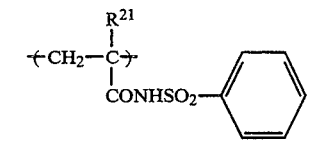

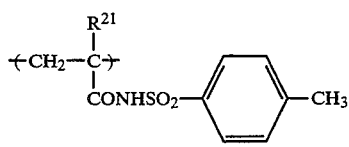

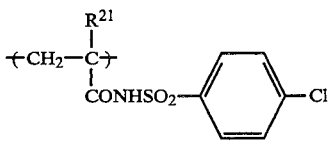

Preferred examples of the chain transfer agent and the polymerization initiator having the specific reactive group used in the synthesis of the macromer of the formula (XI) include those mentioned hereinbefore in connection with the preparation of the macromers of the formula (V).

These chain transfer agents and the polymerization initiators are used in an amount of 0.1 to 15% by weight, preferably 0.5 to 10% by weight of the total weight of the monomers.

Though the structural unit of the formula (VIII) may totally be composed of units of the formula (IX), it may contain other structural units. In such a case, the macromer of the formula (XI) can be prepared by using other polymerizable monomers.

Examples of such polymerizable monomers include those mentioned hereinbefore in connection with the preparation of the macromers of the formula (V), i.e., those mentioned as the polymerizable monomers other than those of formula (VI) that are usable for the preparation of the macromers of the formula (V).

Among those polymerizable monomers, preferably used are acrylates, methacrylates, acrylamides, methacrylamides, acrylonitrile and methacrylonitrile. The monomers of the formula (X) are also preferred.

The group Y' in the formula (VIII) consists of 5 to 100% by weight, preferably 20 to 100% by weight of the structural units of the formula (IX).

The polymer compound comprising the units of the formulae (VII) and (VIII) may be composed of only one kind of each unit of the formulae (VII) and (VIII), but it may comprise two or more kinds of those units.

Further, the polymer compound containing the units of formulae (VII) and (VIII) may be totally composed of the units of the formulae (VII) and (VIII), but it may contain other structural units. In such a case, the polymer compounds may be prepared by copolymerization using polymerizable monomers other than the monomers of the formula (X) and the macromers of the formula (XI).

Examples of such polymerizable monomers include acrylates, methacrylates, acrylamides, methacrylamides, allyl compounds, vinyl ethers, vinyl esters, styrenes and crotonates.

Among these polymerizable monomers, preferably used are the foregoing acrylates, methacrylates, acrylamides, methacrylamides, acrylonitrile and methacrylonitrile.

The polymer compounds comprising the units of the formulae (VII) and (VIII) may have the units of the formula (IX) in their main chains.

In the polymer compounds comprising the units of the formulae (VII) and (VIII), their backbones and the group Y' in the formula (VIII) may be block copolymers or random copolymers.

The polymer compound comprising the units of the formulae (VII) and (VIII) comprises preferably not less than 10% by weight, more preferably 20 to 95% by weight of the structural units of the formula (VII) on the basis of the total units constituting the polymer compound.

The polymer compound comprising the units of the formulae (VII) and (VIII) comprises preferably not less than 1% by weight, more preferably 5 to 50% by weight of the structural units of the formula (VIII) on the basis of the total units constituting the polymer compound.

The weight average molecular weight of the macromers used for the preparation of the polymer compounds comprising the units of the formulae (VII) and (VIII) is preferably not less than 500 and more preferably ranges from 700 to 200,000. With respect to the polymer compounds comprising the units of the formulae (VII) and (VIII), the average molecular weight is preferably not less than 2,000 and more preferably ranges from 5,000 to 300,000, the number average molecular weight is not less than 800 and more preferably ranges from 1,000 to 250,000 polydispersity (weight average molecular weight/number average molecular weight) is preferably not less than 1 and more preferably ranges from 1.1 to 10.

The polymer compounds comprising the units of the formulae (VII) and (VIII) may contain unreacted monomers and macromers. In such a case, it is preferred that the polymer binders contain not more than 15% by weight of the unreacted compounds.

These polymer compounds may be prepared in the presence of a solvent such as ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents may be used alone or in any combination.

In the present invention, the polymer compounds may also be used alone or in any combination. The amount of the polymer compounds to be incorporated into the light-sensitive composition of this invention generally ranges from about 5 to 99% by weight and preferably about 10 to 95% by weight on the basis of the total weight of the composition.

The light-sensitive composition of the present invention may optionally comprises sensitizers. The sensitizers are preferably triplet sensitizers which show a maximum absorption at a wavelength of not less than 300 nm so as to practically absorb sufficient quantity of light.

Specific examples the sensitizer are benzophenone derivatives, benzanthrone derivatives, quinones, aromatic nitro compounds, naphthothiazoline derivatives, benzothiazoline derivatives, thioxanthones, naphthothiazole derivatives, ketocoumarin derivatives, benzothiazole derivatives, naphthofuranone compounds, pyrylium salts and thiapyrylium salts. More specifically, there may be mentioned, for instance, Michler's ketones, N,N'-diethylaminobenzophenone, benzanthrone, (3-methyl-1,3-diaza-1,9-benz)anthrone picramide, 5-nitroacenaphthene, 2-chlorothioxanthone, 2-isopropyl-thioxanthone, dimethylthioxanthone, methylthioxanthone-1-ethylcarboxylate, 2-nitrofluorene, 2-dibenzoyl-methylene-3-methylnaphthothiazoline, 3,3-carbonyl-bis(7-diethylaminocoumarin), 2,4,6-triphenyl thiapyrylium perchlorate and 2-(p-chlorobenzoyl)naphthothiazole.

Further, those sensitizers disclosed in J.P. KOKAI Nos. Hei 3-54566, Hei 2-236552, Hei 2-173646 and Hei 2-131236 are also preferred.

The amount of these sensitizers ranges from about 1 to about 20% by weight, preferably 3 to 10% by weight based on the total weight of the light-sensitive composition.

The light-sensitive composition of the present invention may optionally contain a negative working diazonium compound.

Examples of the negative working diazonium compound herein used are diazonium compounds as disclosed in U.S. Pat. No. 3,867,147 and those disclosed in U.S. Pat. No. 2,632,703 and particularly preferred are diazo resins such as condensates of aromatic diazonium salt and, for instance, an active carbonyl group-containing compound such as formaldehyde. Examples of preferred diazo resins are reaction products obtained by condensing a diazo monomer listed below with a condensing agent in a molar ratio ranging from 1:1 to 1:0.5, preferably 1:0.8 to 1:0.6 in the usual manner and then reacting the resulting condensate with an anion.

Examples of the diazo monomers are 4-diazodiphenylamine, 1-diazo-4-N,N-dimethylaminobenzene, 1-diazo-4-N,N-diethylaminobenzene, 1-diazo-4-N-ethyl-N-hydrox yethylaminobenzene, 1-diazo-4-N-methyl-N-hydroxy ethylaminobenzene, 1-diazo-2,5-diethoxy-4-benzoylaminobenzene, 1-diazo-4-N-benzylaminobenzene, 1-diazo-4-N,N-d imethylaminobenzene, 1-diazo-4-morpholinobenzene, 1-diazo-2,5-dimethoxy-4-p-tolylmercaptobenzene, 1-diazo-2-ethoxy-4-

N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrroridinobenzene, 1-diazo-2-chloro-4-N,N-dimethylamino-5-methoxybenzene, 1-diazo-3-methoxy-4-pyrroridinobenzene, 3-methoxy-4-diazodiphenylamine, 3-ethoxy-4-diazodiphenylamine, 3-(n-propoxy)-4-diazodiphenylamine and 3-isopropoxy-4-diazodiphenylamine.

Examples of the condensing agents are formaldehyde, acetaldehyde, propionaldehyde, butylaldehyde, isobutylaldehyde and benzaldehyde.

Examples of the anions are tetrafluoroboric acid residue, hexafluorophosphoric acid residue, triisopropyl naphthalenesulfonic acid residue, 5-nitro-o-toluenesulfonic acid residue, 5-sulfosalicylic acid residue, 2,5-dimethylbenzenesulfonic acid residue, 2,4,6-trimeth ylbenzenesulfonic acid residue, 2-nitrobenzenesulfonic acid residue, 3-chlorobenzenesulfonic acid residue, 3-bromobenzenesulfonic acid residue, 2-fluorocapr ylnaphthalenesulfonic acid residue, dodecylbenzenesulfonic acid residue, 1-naphthol-5-sulfonic acid residue, 2-methoxy-4-hydroxy-5-benzoylbenzenesulfonic acid residue and p-toluenesulfonic acid residue. Among these anions, preferred are hexafluorophosphoric acid residue and alkyl aromatic sulfonic acid residue such as triisopropyl-naphthalenesulfonic acid residue and 2,5-dimethylbenzene-sulfonic acid residue.

Useful examples of the diazonium compound further include diazo resins obtained by condensing the foregoing diazo monomer and an aldehyde having a carboxyl and/or phenol group or its acetal (and optionally the foregoing condensing agent) and then reacting the condensate with the foregoing anion; as well as the diazo resins as disclosed in J.P. KOKAI Nos. Hei 1-102456 and Hei 1-102457. Particularly preferred are those containing carboxylic acid residues.

These diazonium compounds are used in an amount of 0.1 to 15% by weight, preferably 0.3 to 5% by weight on the basis of the total weight of the composition. The light-sensitive composition of the invention may contain two or more kinds of diazonium compounds.

The light-sensitive composition of the present invention may further comprise, in addition to the polymer compounds containing the structural units represented by the formula (I) or the units of the formulae (VII) and (VIII), known alkali-soluble polymer binders such as phenol-formaldehyde resin, cresol-formaldehyde resin, phenol modified xylene resin, polyhydroxystyrene, polyhalogenated hydroxystyrene, carboxyl group-containing epoxy resin, polyacetal resin, acrylic resin, methacrylic resin and carboxyl group-containing polyurethane resin. Such alkali-soluble polymer binders are used in an amount of not more than 70% by weight of the total weight of the composition.

The light-sensitive composition of the present invention may further contain other additives such as agents or composition for obtaining a visible image immediately after imagewise exposure; dyes or pigments for dying images; stabilizers; surfactants; plasticizers and/or other fillers.

Typical examples of the agents or composition for obtaining a visible image immediately after imagewise exposure include a combination of a light-sensitive compound which releases an acid during exposing it to light and an organic dye capable of forming a salt with the acid released. Specific examples thereof are a combination of o-naphthoquinone-diazido-4-sulfonic acid halogenide and a salt-forming organic dye as disclosed in J.P. KOKAI Nos. Sho 50-36209 and Sho 53-8128; and a combination of a trihalomethyl compound and a salt-forming organic dye as disclosed in J.P. KOKAI Nos. Sho 53-36223 and Sho 54-74728. Dyes other than the salt-forming organic dyes may also be used as the agent for dyeing image.

Examples of preferred dyes inclusive of salt-forming organic dyes include oil-soluble dyes and basic dyes and more specifically Oil Yellow #101, Oil Yellow #130, Oil Pink #312, Oil Green BG, Oil Blue BOS, Oil Blue #603, Oil Black BY, Oil Black BS, Oil Black T-505 (these are available from ORIENT CHEMICAL INDUSTRIES, LTD.); Victoria Pure Blue, Crystal Violet (CI 42555), Methyl Violet (CI 42535), Rhodamine B (CI 45170B), Malachite Green (CI 42000) and Methylene Blue (CI 52015).

For the diazonium compounds, the following stabilizers can be used: phosphoric acid, phosphorous acid, pyrophosphoric acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, malic acid, tartaric acid, dipicolinic acid, polyacrylic acid and copolymers thereof, polyvinyl phosphonic acid and copolymers thereof, polyvinylsulfonic acid and copolymers thereof, 5-nitronaphthalene-1-phosphonic acid, 4-chlorophenoxymethyl phosphonic acid, sodium phenyl-methyl-pyrazolone sulfonate, 2-phosphonobutanetricarboxylic acid-1,2,4, 1-phosphonoethanetricarboxylic acid-1,2,2 and 1-hydroxyethane-1,1disulfonic acid.

In addition to the above-described components, it is desirable that at least one heat polymerization inhibitor be added to the light-sensitive composition of the present invention and examples of such heat polymerization inhibitors are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

Moreover, the light-sensitive composition of the present invention may further comprise other additives, for instance, alkyl ethers for improving coating properties thereof such as ethyl cellulose and methyl cellulose; surfactants such as fluorine type surfactants; plasticizers for imparting flexibility and wear resistance to the resultant film such as tricresyl phosphate, dimethyl phthalate, dibutyl phthalate, trioctyl phosphate, tributyl phosphate, tributyl citrate, polyethylene glycol and polypropylene glycol. The amount of these additives may vary depending on the purposes of the addition thereof, but in general it ranges from 0.5 to 30% by weight on the basis of the total weight of the solid present in the light-sensitive layer.

The light-sensitive composition of the present invention is dissolved in a solvent capable of dissolving the aforementioned components and applied to the surface of a substrate. Examples of such solvents used herein include methanol, ethanol, isopropanol, n-butanol, t-butanol, ethylene dichloride, cyclohexanone, acetone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, N,N-dimethylformamide, tetrahydrofuran, dioxane, dimethylsulfoxide, ethyl acetate, methyl lactate and ethyl lactate. These solvents may be used alone or in combination.

It is also preferred to use mixed solvents obtained by adding, to the solvent listed above or mixture thereof, a small amount of other solvent(s) such as water and toluene which does not dissolve the diazo resins and polymer binders. The concentration of the foregoing components ranges from 1 to 50% by weight (solid content).

After applying such a light-sensitive solution, the applied layer is dried desirably at a temperature of 50° to 120° C. The drying may be carried out by first subjecting the layer to preliminary drying operation at a rather low temperature and then to drying operation at an elevated temperature. The coated layer may directly be dried at an elevated temperature if the solvent and the concentration of the coating solution are properly selected.

The coated amount of the light-sensitive solution varies depending on the applications of the composition. For instance, it ranges from 0.5 to 3.0 g/m$^2$ for the composition used to form PS plates. As the coated amount of the composition decreases, the light-sensitivity of the resultant layer increases, but the physical properties thereof are lowered.

Examples of the substrates to which the light-sensitive composition of the invention is applied include paper, paper laminated with a plastic sheet such as a polyethylene, polypropylene or polystyrene sheet; metal plates such as aluminum (inclusive of aluminum alloys), zinc and copper plates; plastic films such as cellulose diacetate, cellulose triacetate, cellulose propionate, cellulose acetate, cellulose acetate butyrate, cellulose butyrate, polyethylene terephthalate, polyethylene, polystyrene, polypropylene, polycarbonate and polyvinyl acetal; and paper or plastic films which are laminated with a foil of the foregoing metals or to which such a metal is deposited. Among these, an aluminum plate is particularly preferred because of its high dimensional stability and low cost. In addition, composite sheets comprising polyethylene terephthalate to which an aluminum sheet is bonded as disclosed in Japanese Patent Publication for Opposition Purpose (hereinafter referred to "J.P. KOKOKU") No. Sho 48-18327 are also preferred.

If the the substrate has a metal surface, in particular an aluminum surface, it is desirable to subject it to hydrophilization treatment.

Examples of such hydrophilization treatments include such a mechanical method as wire brush graining, brush graining in which the aluminum surface is grained with a nylon brush while pouring a slurry of abrasive particles and ball graining; a chemical graining in which HF, AlCl$_3$ and HCl are used as etching agents; electrolytic graining in which nitric acid or hydrochloric acid is used as an electrolyte; and a combined graining composed of a combination thereof. The substrate having aluminum surface may preferably be subjected to etching treatment with an acid or an alkali and subsequently to anodization by passing an electric current (D.C. or A.C.) through the aluminum surface in an electrolyte such as sulfuric acid, phosphoric acid, oxalic acid, boric acid, chromic acid, sulfamic acid or mixture thereof to form a strong passive film on the aluminum surface. The aluminum surface is made hydrophilic by such a passive film per se. However, particularly preferred are those further subjected to silicate (sodium silicate and potassium silicate) treatment as disclosed in U.S. Pat. Nos. 2,714,066 and 3,181,461; potassium fluorozirconate treatment as disclosed in U.S. Pat. No. 2,946,638; phosphomolybdate treatment as disclosed in U.S. Pat. No. 3,201,247; alkyl titanate treatment as disclosed in U.K. Patent No. 1,108,559; polyacrylic acid treatment as disclosed in German Patent No. 1,091,433; polyvinyl sulfonic acid treatment as disclosed in German Patent No. 1,134,093 and U.K. Patent No. 1,230,447; phosphonic acid treatment as disclosed in J.P. KOKOKU No. Sho 44-6409; phytic acid treatment as disclosed in U.S. Pat. No. 3,307,951; a combined treatment composed of treatments with a hydrophilic organic polymer compound and a divalent metal as disclosed in J.P. KOKAI Nos. Sho 58-16893 and Sho 58-18291; application of an underlying coating of water-soluble polymer having sulfonic acid group(s) as disclosed in J.P. KOKAI No. Sho 59-101651. Furthermore, other examples of hydrophilic treatments also include silicate electrodeposition as disclosed in U.S. Pat. No. 3,658,662.

The light-sensitive composition of the present invention which is applied to the surface of the substrate is imagewise exposed to light through an original transparency carrying line or half-tone dot images and then developed with an aqueous alkali developer to provide relief images negative with respect to the original.

As light sources used in the exposure, there may be named, for instance, a carbon arc lamp, a mercury lamp, a xenon lamp, a metal halide lamp, a strobo, ultraviolet rays and laser beams.

Examples of the aqueous alkaline developer used for development of the PS plates after the light exposure include the developer compositions of J.P. KOKAI No. Sho 51-77401, which comprise benzyl alcohol, anionic surfactant, alkaline agent and water, the developer compositions of J.P. KOKAI No. Sho 53-44202 (=U.S. Pat. No. 4,186,006), which comprise an aqueous solution containing benzyl alcohol, anionic surfactant and water-soluble sulfite salt and the developer compositions of J.P. KOKAI No. Sho 55-155355, which comprise water, alkaline agent and an organic solvent whose solubility in water is less than 10% by weight at room temperature.

Though the above-mentioned developers may be used for the light-sensitive composition of the invention, all of these developers contain organic solvents. Organic solvents normally have toxicity, nasty odor and inflammability, i.e., a risk of causing a fire, drainage thereof must satisfy the strict BOD regulations and hence these drawbacks of the organic solvents lead to high cost of the process using them. Therefore, it is desirable to use developers substantially free of organic solvent. The expression of "substantially free of organic solvent" herein means that the content of organic solvent in the developer composition is less than 3% by weight on the basis of the total weight of the composition. The developer composition preferably contains not more than 1%, more preferably 0.5% by weight of organic solvent, and those not containing organic solvent at all are the best.

As examples of the developer substantially free of organic solvent, there can be mentioned the developers used for the development of positive-working PS plates and the like. However, because of the strong alkalinity of those developers, they may cause a rash, inflammation and the like when they contact with human skin.

Therefore, the preferred developer compositions used in the present invention are substantially free of organic solvent and have a pH value of not more than 12.

Preferred examples of the alkaline agent used in the developer composition include mild alkaline agents and salts of weak acid and strong base, for example, organic amines such as monoethanolamine, diethanolamine, triethanolamine, sodium carbonate, potassium carbonate, sodium hydrogen carbonate, potassium hydrogen carbonate, sodium or potassium salt of organic carboxylic acid, primary, secondary and tertiary sodium or potassium salts of phosphoric acid, primary, secondary and tertiary sodium or potassium salts of boric acid and the like. Among those alkaline agents, particularly preferred are the organic amines and the carbonates. The developer preferably contains two or more kinds of the alkaline agents to prevent degradation of the developer.

These alkaline agents are used in an amount of not more than 10% by weight of the developer.

The developer may contain surfactants, for example, anionic surfactants and amphoteric surfactants such as those disclosed in J.P. KOKAI No. Sho 50-51324 and non-ionic surfactants such as those disclosed in J.P. KOKAI Nos. Sho 59-75255 and Sho 60-111246. Those surfactants may be used in an amount of not more than 10%, preferably not more than 6% by weight of the developer.

The developer may further comprise water-soluble sulfites such as sodium sulfite. Those sulfites are used in an amount of not more than 5% by weight of the developer composition.

The developers preferably have a pH value of not more than 12, more preferably of from 8 to 11.5.

When the light-sensitive compositions of the present invention are developed by the developers described above, the polymer binders of the present invention are preferably soluble or dispersible in the developer, though it may be only swellable in the developer. When such a swellable polymer binder is used, it is preferred that the light-sensitive composition of the present invention is mechanically removed by a brush or the like after the immersion in the developer.

The light-sensitive composition of the invention exhibits excellent wear resistance when it is photo-cured, and hence it can give lithographic printing plates capable of producing a lot of printed matter in good quality when it is used for PS plates.

EXAMPLES

The present invention will hereinafter be described in more detail with reference to the following non-limitative synthesis examples and working examples and the effects practically achieved by the invention will also be discussed in detail in comparison with comparative examples.

Synthesis Example 1: Synthesis of Macromer (MM-1)

In a flask equipped with a stirrer and a condenser, 2-methoxyethyl acetate (100 g) was heated at 85° C. and stirred under a nitrogen flow. To this flask, a mixture of β-mercaptopropionic acid (5 g), 4,4'-azobis(4-cyanovaleric acid) (0.8 g), 2-methoxyethyl acetate (100 g) and a compound represented by the following formula (a) (95 g) was added dropwise at a constant rate over 2.5 hours.

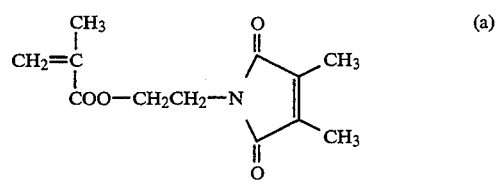

After the addition, the reaction mixture was stirred at 85° C. for 3 hours.

After cooling to room temperature, the reaction mixture was added with 2-hydroxyethyl methacrylate (18.4 g) and 4-(N,N-dimethylamino)pyridine (1.2 g) and further added with a solution of dicyclohexyl carbodiimide (29.2 g) in methylene chloride (50 ml) dropwise over 1 hour. After the addition, the reaction mixture was stirred for 4 hours at room temperature. Then, the mixture was added with formic acid (7 ml) and stirred for 1 hour at room temperature and insolubles were removed by filtration through a Celite layer.

The filtrate was poured into hexane (1.5 litres) with stirring, further stirred for a while and left stand to remove the supernatant. The residue was washed with methanol (0.6 litres) and dried under reduced pressure to give a viscous product (58 g). The weight average molecular weight of the product was determined by gel permeation chromatography and found to be 2,700 (standard : polystyrene).

Synthesis Examples 2 to 4: Synthesis of Macromers (MM-2 to MM-4)

Referring to the foregoing prior art documents, the following macromers, MM-2 to MM-4, were synthesized in the same manner as in Synthesis Example 1. The weight average molecular weight of these macromers were determined to be 1,800 to 11,000 (standard: polystyrene).

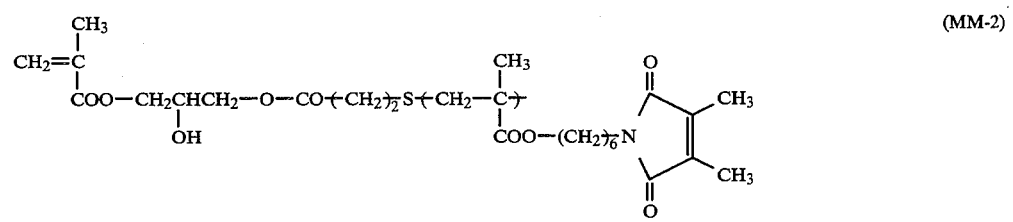

-continued

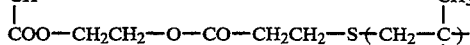
(MM-3)

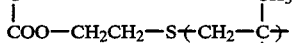
(MM-4)

Synthesis Example 5: Synthesis of Polymer Compound (GP-1)

In a flask equipped with a stirrer and a condenser, methoxy-2-propanol (100 g) was heated at 75° C. and stirred under a nitrogen flow. To this flask, a mixture of the foregoing macromer, MM-1 (20 g), the foregoing compound of the formula (a) (60 g), methacryl acid (20 g), 2,2'-azobis(dimethyl isobutyrate) (1 g) and 1-methoxy-2-propanol (100 g) was added dropwise at a constant rate over 2.5 hours. After the addition, the reaction mixture was further stirred for 3 hours at 75° C. and poured into water (3 litres) with stirring.

The precipitate was collected by filtration and dried to give a white solid (92 g). The weight average molecular weight of the product was determined by gel permeation chromatography and found to be 59,000 (standard : polystyrene).

Synthesis Examples 6 to 12: Synthesis of Polymer Compounds (GP-2 to GP-8)

In the same manner as in Synthesis Example 5, polymer compounds GP-2 to GP-8 were synthesized. The weight average molecular weight of these macromers were determined to be 38,000 to 120,000 (standard: polystyrene). The macromers and the monomers used in the syntheses of the polymer compounds are summarized in Table 1 below.

TABLE 1

| Copolymer | Macromer (Weight ratio) | Monomer (Weight ratio) | |
|---|---|---|---|
| GP-1 | MM-1 (20) | $CH_2{=}C(CH_3){-}COO{-}CH_2CH_2{-}N$(dimethylmaleimide) (60) | $CH_2{=}C(CH_3){-}COOH$ (20) |
| GP-2 | MM-2 (15) | $CH_2{=}C(CH_3){-}COO{-}(CH_2)_6{-}N$(dimethylmaleimide) (60) | $CH_2{=}C(CH_3){-}COOH$ (25) |
| GP-3 | MM-3 (25) | $CH_2{=}C(CH_3){-}COO{-}(CH_2)_6{-}N$(dimethylmaleimide) (55) | $CH_2{=}C(CH_3){-}CONH{-}C_6H_4{-}CH_2{-}P(=O)(OH)_2$ (20) |

TABLE 1-continued

| Copolymer | Macromer (Weight ratio) | Monomer (Weight ratio) |
|---|---|---|
| GP-4 | MM-1 (20) | CH$_2$=C(CH$_3$)COO—CH$_2$CH$_2$—N(dimethylmaleimide) (60); CH$_2$=C(CH$_2$)CO—O—CH$_2$CH$_2$—O—P(=O)(OH)(OH) (20) |
| GP-5 | MM-2 (20) | CH$_2$=C(CH$_3$)COO—CH$_2$CH$_2$—N(dimethylmaleimide) (50); CH$_2$=CH—COOH (15); CH$_2$=CH—CONH—C(CH$_3$)(CH$_3$)—CH$_2$—SO$_3$H (15) |
| GP-6 | MM-1 (20) | CH$_2$=C(CH$_3$)COO—CH$_2$CH$_2$—N(dimethylmaleimide) (50); CH$_2$=C(CH$_3$)CONHSO$_2$—C$_6$H$_5$ (30) |
| GP-7 | MM-4 (20) | CH$_2$=C(CH$_3$)COO—CH$_2$CH$_2$—O—CO—CH=CH—C$_6$H$_5$ (55); CH$_2$=C(CH$_3$)COOH (25) |
| GP-8 | MM-4 (20) | CH$_2$=C(CH$_3$)COO—CH$_2$CH$_2$—O—CO—CH=CH—C$_6$H$_5$ (60); CH$_2$=C(CH$_3$)COOH (10); CH$_2$=C(CH$_3$)COO—CH$_2$CH$_2$—O—P(=O)(OH)(OH) (10) |

Synthesis of Comparative Polymer Compound (LP-1)

By following the same procedure as the synthesis of the polymer compound GP-1 except that the foregoing compound of the formula (a) was used instead of the macromer MM-1, the comparative polymer compound LP-1 was prepared. The weight average molecular weight of LP-1 was determined by gel permeation chromatography and found to be 51,000 (standard : polystyrene).

Synthesis of Comparative Polymer Compound (LP-2)

By following the same procedure as the synthesis of the polymer compound GP-7 except that a compound of the following formula (b) was used instead of the macromer MM-4, the comparative polymer compound LP-2 was prepared. The weight average molecular weight of LP-2 was determined by gel permeation chromatography and found to be 45,000 (standard : polystyrene).

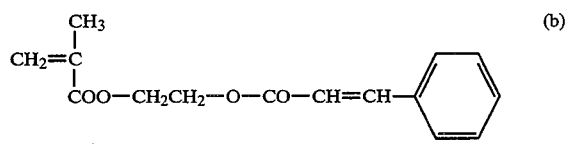
(b)

Example 1

Substrates for PS plates were prepared according to the method disclosed in J.P. KOKAI Sho 56-28893. The surface of an aluminum plate having a thickness of 0.24 mm was grained using a nylon brush and an aqueous suspension of 400 mesh pumice stone and then sufficiently washed with water. The plate was immersed in 10% aqueous solution of sodium hydroxide at 70° C. for 60 seconds to etch the plate, followed by washing with running water, neutralizing and washing with 20% nitric acid solution and washing with water. Then, the plate was electrolytically grained in 1% aqueous nitric acid solution utilizing an alternating waved current with the conditions of the ratio of the quantity of electricity at the cathode time to that of at the anode of 0.8 and the quantity of electricity at the anode time of 160 coulomb/dm$^2$. The surface roughness at this stage was determined and found to be 0.6μm (Ra unit). Subsequently, the aluminum plate was immersed in 30% aqueous sulfuric acid solution at 55° C. for two minutes to desmut the plate and was anodized in 20% sulfuric acid solution until the thickness of the resultant aluminum oxide film was 2.7 g/m$^2$. Thereafter, the plate was immersed in 2.5% aqueous solution of sodium silicate maintained at 70° C. for one minute, then washed with water and dried. Solutions of light-sensitive compositions having the following composition (hereinafter referred to as "light-sensitive solution(s)"), [V]-1 to [V]-8, were applied to the surface of the aluminum plate thus prepared using a whirler and dried at 100° C. for two minutes. The amount of the composition applied was 2.0 g/m$^2$ (weighed after drying).

The polymer compounds of the invention used in the light-sensitive solutions [V]-1 to [V]-8 are listed in Table 2 below.

| Light-sensitive Solution [V] | |
|---|---|
| Component | Amount (g) |
| Polymer compound of the invention (Table 2) | 5.0 |
| Compound of the following formula | 0.3 |
| 4-n-Dodecylbenzenesulfonic acid salt of the condensate of 4-diazodiphenylamine, phenoxyacetic acid and formaldehyde | 0.1 |
| 10% plastisizer dispersion containing copper phthalocyanine pigment (CI Pigment Blue 15) | 1.0 |
| Fluorad FC-430 (fluorine type surfactant available from U.S. 3M Co., Ltd.) | 0.05 |
| 1-Methoxy-2-propanol | 100 |

In addition, light-sensitive solutions [W]-1 and [W]-2 containing the comparative polymer compounds LP-1 and LP-2 respectively instead of the polymer compound of the invention in the light-sensitive solution [V] described above were applied to the same aluminum substrates. The amount of the composition applied was 2.0 g/m$^2$ (weighed after drying). The comparative polymer compounds used in the light-sensitive solutions [W]-1 and [W]-2 are also listed in Table 2 below.

The PS plates [V]-1 to [V]-8, [W]-1 and [W]-2, which were obtained by using the light-sensitive solutions [V]-1 to [V]-8, [W]-1 and [W]-4, were imagewise exposed to light for one minute using a PS Light (available from Fuji Photo Film Co., Ltd.) disposed at a distance of 1 m therefrom, immersed in the following developer [S] for 50 seconds and then the surface thereof was lightly rubbed with a brush to remove the unexposed portions. The developer [S] had a pH value of not more than 12.

| Developer [S] | |
|---|---|
| Component | Amount (g) |
| NaHCO$_3$ | 10 |

| Developer [S] | |
|---|---|
| Component | Amount (g) |
| Na$_3$CO$_3$ | 20 |
| (naphthalene compound with C$_4$H$_9$ and SO$_3$Na groups) | 50 |
| Water | 920 |

Each lithographic printing plate thus obtained was set up on GTO printing press (available from Heidelberg Co.,Ltd.) and printing was performed using wood-free paper and commercially available oil ink to determine the possible number of printed matter in good quality for each of the printing plates, [V]-1 to [V]-8, [W]-1 and [W]-2. The results are shown in Table 2. As seen from the results of Table 2, all of the PS plates utilizing the light-sensitive compositions of the invention [V]-1 to [V]-8 exhibited higher copy numbers of printed matter than the comparative PS plates [W]-1 and [W]-2, and this means that the light-sensitive compositions of the invention prividied higher printing durability as compared with the comparative light-sensitive compositions.

TABLE 2

| PS plate | Polymer Compound | Copy Number of Printed matter |
|---|---|---|
| [V]-1 | GP-1 | 50,000 |
| [V]-2 | GP-2 | 55,000 |
| [V]-3 | GP-3 | 52,000 |
| [V]-4 | GP-4 | 45,000 |
| [V]-5 | GP-5 | 40,000 |
| [V]-6 | GP-6 | 45,000 |
| [V]-7 | GP-7 | 40,000 |
| [V]-8 | GP-8 | 41,000 |
| Comparative Examples | | |
| [W]-1 | LP-1 | 35,000 |
| [W]-2 | LP-2 | 30,000 |

Example 2

The PS plates [V]-1, [V]-7, [W]-1 and [W]-2 obtained in Example 1 were imagewise exposed to light for one minute using a PS Light (available from Fuji Photo Film Co., Ltd.) disposed at a distance of 1 m therefrom, immersed in either of the following developers [T] and [U] for 50 seconds and then the surface thereof was lightly rubbed with a brush to remove the unexposed portions. The developers [T] and [U] had a pH value of not more than 12.

| Developer [T] | |
|---|---|
| Component | Amount (g) |
| NaHCO$_3$ | 15 |
| Na$_2$CO$_3$ | 25 |
| Water | 960 |

| Developer [U] | |
|---|---|
| Component | Amount (g) |
| Triethanolamine | 20 |

-continued

| Developer [U] | |
|---|---|
| Component | Amount (g) |
| Monoethanolamine | 2 |
| Water | 978 |

Each lithographic printing plate thus obtained was set up on GTO printing press (available from Heidelberg Co.,Ltd.) and printing was performed using woodfree paper and commercially available oil ink to determine the possible number of printed matter in good quality for each of the printing plates, [V]-1, [V]-7, [W]-1 and [W]-2. The results are shown in Table 3. As seen from the results of Table 3, the PS plates [V]-1 and [V]-7 utilizing the light-sensitive composition of the invention exhibited higher copy numbers of printed matter than the comparative PS plates [W]-1 and [W]-2, and this means that the light-sensitive composition of the invention provided higher printing durability as compared with the comparative light-sensitive composition.

TABLE 3

| PS plate | Developer | Copy Number of printed Matter |
|---|---|---|
| [V]-1 | [T] | 48,000 |
| [V]-1 | [U] | 50,000 |
| [V]-7 | [T] | 40,000 |
| [V]-7 | [U] | 42,000 |
| Comparative Examples | | |
| [W]-1 | [T] | 34,000 |
| [W]-1 | [U] | 35,000 |
| [W]-2 | [T] | 30,000 |
| [W]-2 | [U] | 31,000 |

Synthesis Example 13: Synthesis of Macromer (MM-5)

In a flask equipped with a stirrer and a condenser, 2-methoxyethyl acetate (100 g) was heated at 85° C. and stirred under a nitrogen flow.

To this flask, dimethyl-t-butylsilyl methacrylate (95 g), $\beta$-mercaptopropionic acid (5 g), 4,4'-azobis(4-cyanovaleric acid) (0.8 g) and 2-methoxyethyl acetate (100 g) were added dropwise at a constant rate over 2.5 hours and further stirred for 3 hours at 85° C.

Then, the mixture was added with glycidyl methacrylate (13.4 g), N,N-dimethyldodecylamine (2 g) and t-butylhydroquinone (1.5 g) and stirred at 110° C. for 8 hours.

After cooling, the reaction mixture was added with p-toluenesulfonic acid (5 g) and 90% by weight aqueous solution of N,N-dimethylacetamide (200 ml), heated at 40° C. and stirred for 1 hour.

After cooling, the reaction mixture was poured into a mixed solution of water and acetone (volume ratio=1:5, 2 litres) to reprecipitate the objective product and the precipitate was collected by decantation. The precipitate was washed with acetone and dried to give a viscous product (68 g). The weight average molecular weight of the product was determined by gel permeation chromatography and found to be 3,800 (standard : polystyrene).

Synthesis Example 14: Synthesis of Macromer (MM-6)

In a flask equipped with a stirrer and a condenser, 2-methoxyethyl acetate (100 g) was heated at 70° C. and stirred under a nitrogen flow. To this flask, a mixture of the foregoing compound of the formula (a) (50 g), methacryl acid (50 g), 2-mercaptoethanol (4 g), 2,2'-azobisisobutylonitrile (1.2 g) and 2-methoxyethyl acetate (100 g) was added dropwise at a constant rate over 4 hours and further stirred for 4 hours at 70° C.

Then, the reaction mixture was cooled to room temperature, added with pyridine (12.1 g) and further added with methacrylic acid chloride (16.1 g) dropwise. Thereafter, the reaction mixture was stirred 1 hour at room temperature, added with t-butylhydroquinone (0.5 g) and further stirred for 2 hours at 60° C.

After cooling, the mixture was poured into water (2 litres) with stirring, stirred for 1 hour and left stand to remove the water by decantation. The residue was washed twice with water, dissolved in 1-methoxy-2-propanol (200 ml) and reprecipitated in petroleum ether (2 litres). The precipitate was collected by decantation and dried under reduced pressure to give a viscous product (55 g). The weight average molecular weight of the product was determined by gel permeation chromatography and found to be 4,400 (standard : polystyrene).

Synthesis Example 15: Synthesis of Macromer (MM-7)

In a flask equipped with a stirrer and a condenser, N,N-dimethylacetamide (100 g) was heated at 85° C. and stirred under a nitrogen flow.

To this flask, a mixture of the foregoing compound of the formula (a) (40 g), 2-hydroxyethyl methacrylate (60 g), 4,4'-azobis(4-cyanovaleric acid) (0.7 g), thioglycolic acid (4 g) and N,N-dimethylacetamide (100 g) was added dropwise at a constant rate over 2.5 hours and further stirred for 3 hours at 85° C.

Then, the mixture was added with glycidyl methacrylate (12 g), N,N-dimethyldodecylamine (2 g) and t-butylhydroquinone (1.2 g) and stirred at 110° C. for 8 hours.

After cooling, the reaction mixture was added with acetic acid (20 g) and poured into water (2 litres) to reprecipitate the objective product and the precipitate was collected by decantation. The precipitate was washed with a mixture of tetrahydrofuran and hexane and dried to give a viscous product.

The obtained viscous product was charged into a flask with N,N-dimethylacetamide (300 g).

Then, the mixture was added with triethylamine (56 g) and succinic anhydride (55.4 g) and stirred for 5 hours at 80° C.

After cooling, the reaction mixture was added with acetic acid (200 g) and poured into water (3 litres) to reprecipitate the objective product and the precipitate was collected by decantation. The precipitate was washed with water and dried to give a viscous product (91 g). The weight average molecular weight of the product was determined by gel permeation chromatography and found to be 5,900 ( standard : polystyrene ).

Synthesis Examples 16 to 20: Synthesis of Macromers (MM-8 to MM-12)

In the same manner as in Synthesis Examples 13 to 15, the following macromers, MM-8 to MM-12, were synthesized. The weight average molecular weight of these macromers were determined to be 1,800 to 11,000 (standard: polystyrene). The appended numbers represent the weight ratios of the structural unit in the macromers.

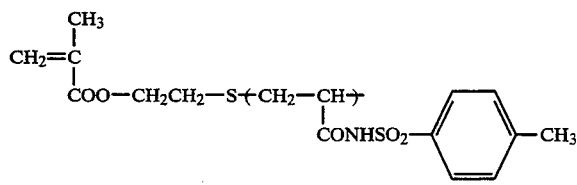
(MM-8)

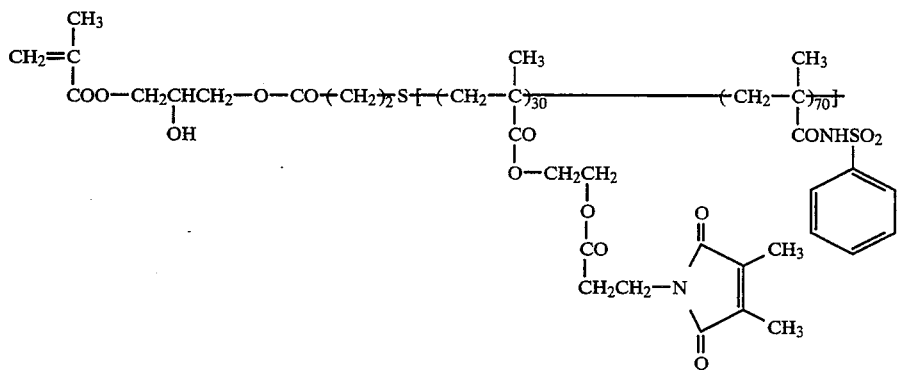
(MM-9)

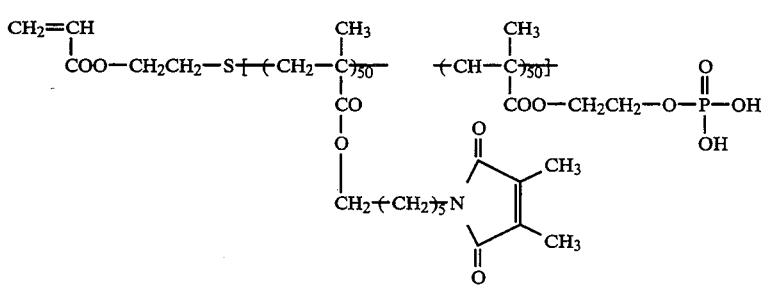
(MM-10)

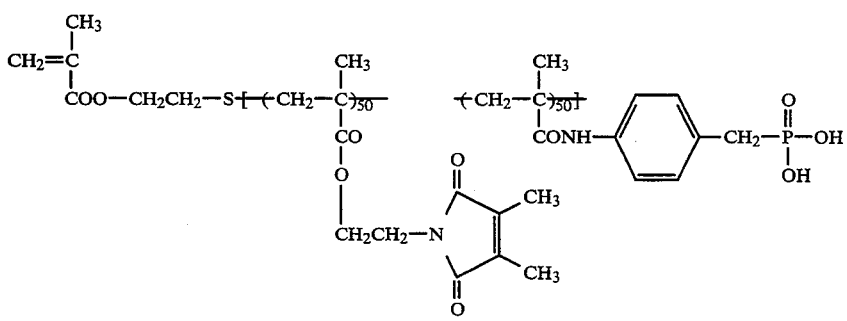
(MM-11)

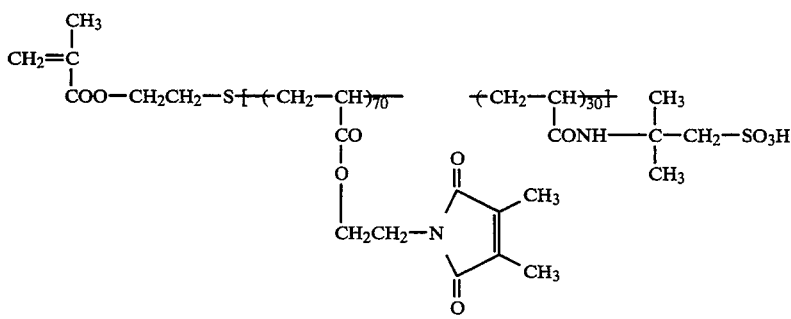
(MM-12)

Synthesis Example 21: Synthesis of Polymer Compound (GP-9)

In a flask equipped with a stirrer and a condenser, the foregoing macromer, MM-5 (20 g), N,N-dimethylacetamide (200 g) and water (50 g) were heated at 75° C. and stirred under a nitrogen flow. To this flask, a mixture of the foregoing compound of the formula (a) (80 g), 2,2'-azobis(dimethyl isobutyrate) (1 g) and N,N-dimethylacetamide (50 g) was added dropwise at a constant rate over 2.5 hours. After the addition, the reaction mixture was further stirred for 3 hours at 75° C. and poured into water (3 litres) with stirring.

The precipitate was collected by filtration and dried to give a white solid (89 g). The weight average molecular weight of the product was determined by gel permeation chromatography and found to be 42,000 (standard : polystyrene).

Synthesis Example 22: Synthesis of Polymer Compound (GP-10)

In a flask equipped with a stirrer and a condenser, 1-methoxy-2-propanol (50 g) was heated at 75° C. and stirred under a nitrogen flow. To this flask, a mixture of the foregoing macromer, MM-6 (30 g), the foregoing compound of the formula (a) (70 g), 2,2'-azobis(-dimethyl isobutyrate) (1 g) and 1-methoxy-2-propanol (250 g) was added dropwise at a constant rate over 2.5 hours. After the addition, the reaction mixture was further stirred for 3 hours at 75° C. and poured into water (3 litres) with stirring.

The precipitate was collected by filtration and dried to give a white solid (91 g). The weight average molecular weight of the product was determined by gel permeation chromatography and found to be 49,000 (standard : polystyrene).

Synthesis Examples 23 to 30: Synthesis of Polymer Compounds (GP-11 to GP-18)

In the same manner as in Synthesis Examples 21 and 22, polymer compounds GP-11 to GP-18 were synthesized. The weight average molecular weight of these macromers were determined to be 37,000 to 140,000 (standard: polystyrene).

The macromers and the monomers used in the syntheses of the polymer compounds are summarized in Table 4 below.

TABLE 4

| Copolymer | Macromer (Weight ratio) | Monomer (Weight ratio) | |
|---|---|---|---|
| GP-9 | MM-5 (20) | 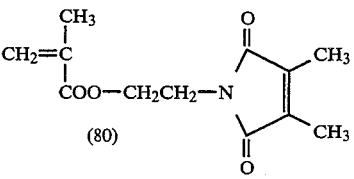 (80) | |
| GP-10 | MM-6 (30) | 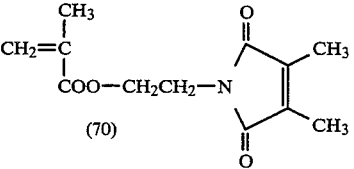 (70) | |
| GP-11 | MM-7 (20) | 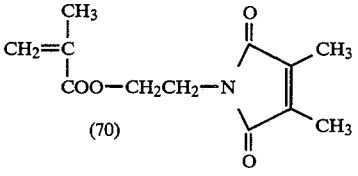 (70) | CH₃\|CH₂=C\|COOH (10) |
| GP-12 | MM-8 (30) | 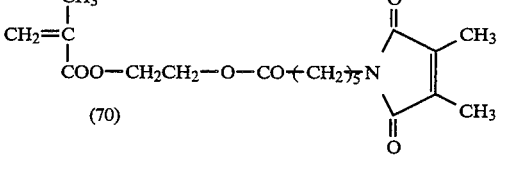 (70) | |
| GP-13 | MM-9 (25) | 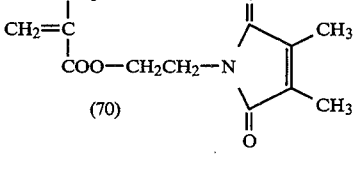 (70) | CH₃\|CH₂=C\|COOH (5) |
| GP-14 | MM-10 (20) | 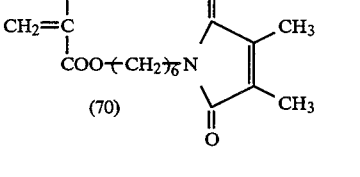 (70) | CH₃\|CH₂=C\|COOH (10) |

TABLE 4-continued

| Copolymer | Macromer (Weight ratio) | Monomer (Weight ratio) | | |
|---|---|---|---|---|
| GP-15 | MM-11 (20) | 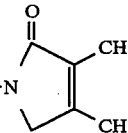 (70) | | CH$_2$=C(CH$_3$)COOH (10) |
| GP-16 | MM-12 (10) | 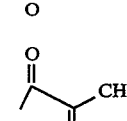 (75) | | CH$_2$=C(CH$_3$)COOH (15) |
| GP-17 | MM-5 (20) | CH$_2$=C(CH$_3$)COO—CH$_2$CH$_2$—O—CO—CH=CH—C$_6$H$_5$ (80) | | |
| GP-18 | MM-8 (20) | CH$_2$=C(CH$_3$)COO—CH$_2$CH$_2$—O—CO—CH=CH—C$_6$H$_5$ (70) | | CH$_2$=C(CH$_3$)COOH (10) |

Synthesis of Comparative Polymer Compound (LP-3)

By following the same procedure as the synthesis of the polymer compound GP-9 except that methacrylic acid was used instead of the macromer MM-5, the comparative polymer compound LP-3 was prepared. The weight average molecular weight of LP-3 was determined by gel permeation chromatography and found to be 39,000 (standard : polystyrene).

Synthesis of Comparative Polymer Compound (LP-4)

By following the same procedure as the synthesis of the polymer compound GP-17 except that methacrylic acid was used instead of the macromer MM-5, the comparative polymer compound LP-4 was prepared. The weight average molecular weight of LP-4 was determined by gel permeation chromatography and found to be 35,000 (standard : polystyrene).

Example 3

Substrates for PS plates were prepared in the same manner as in Example 1. Light-sensitive solutions having the following composition, [V]-9 to [V]-18, were applied to the surface of the aluminum plate thus prepared using a whirler and dried at 100° C. for two minutes. The amount of the composition applied was 2.0 g/m² (weighed after drying).

The polymer compounds of the invention used in the light-sensitive solutions [V]-9 to [V]-18 are listed in Table 5 below.

| Light-sensitive Solution [V] | |
|---|---|
| Component | Amount (g) |
| Polymer compound of the invention (Table 5) | 5.0 |
| Compound of the following formula | 0.3 |

| -continued Light-sensitive Solution [V] | |
|---|---|
| Component | Amount (g) |
| 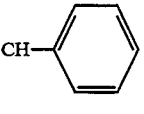 | |
| 4-n-Dodecylbenzenesulfonic acid salt of the condensate of 4-diazodiphenylamine, phenoxyacetic acid and formaldehdye | 0.1 |
| 10% plastisizer dispersion containing copper phthalocyanine pigment (CI Pigment Blue 15) | 1.0 |
| Fluorad FC-430 (fluorine type surfactant available from U.S. 3M Co., Ltd.) | 0.05 |
| 1-Methoxy-2-propanol | 100 |

In addition, light-sensitive solutions [W]-3 and [W]-4 containing the comparative polymer compounds LP-3 and LP-4 respectively instead of the polymer compound of the invention in the light-sensitive solution [V] described above were applied to the same aluminum substrates. The amount of the composition applied was 2.0 g/m² (weighed after drying). The comparative polymer compounds used in the light-sensitive solutions [W]-3 and [W]-4 are also listed in Table 5 below. The PS plates [V]-9 to [V]-18, [W]-3 and [W]-4, which were obtained by using the light-sensitive solutions [V]-9 to [V]-18, [W]-3 and [W]-4, were imagewise exposed to light for one minute using a PS Light (available from Fuji Photo Film Co., Ltd.) disposed at a distance of 1 m therefrom, immersed in the foregoing developer [S] for 50 seconds and then the surface thereof was lightly rubbed with a brush to remove the unexposed portions.

Each lithographic printing plate thus obtained was set up on GTO printing press (available from Heidelberg Co., Ltd.) and printing was performed using wood-free paper and commercially available oil ink to determine the possible number of printed matter in good quality for each of the printing plates, [V]-9 to [V]-18, [W]-3 and [W]-4. The results are shown in Table 5. As seen from the results of Table 5, all of the PS plates utilizing the light-sensitive compositions of the invention [V]-9 to [V]-18 exhibited higher copy numbers of printed matter than the comparative PS plates [W]-3 and [W]-4, and this means that the light-sensitive compositions of the invention privided higher printing durability as compared with the comparative light-sensitive compositions.

TABLE 5

| PS plate | Polymer Compound | Copy Number of Printed matter |
|---|---|---|
| [V]-9 | GP-9 | 50,000 |
| [V]-10 | GP-10 | 52,000 |
| [V]-11 | GP-11 | 50,000 |
| [V]-12 | GP-12 | 55,000 |
| [V]-13 | GP-13 | 53,000 |
| [V]-14 | GP-14 | 46,000 |
| [V]-15 | GP-15 | 48,000 |
| [V]-16 | GP-16 | 45,000 |
| [V]-17 | GP-17 | 43,000 |
| [V]-18 | GP-18 | 45,000 |
| Comparative Examples | | |
| [W]-3 | LP-3 | 37,000 |
| [W]-4 | LP-4 | 32,000 |

Example 4

The PS plates [V]-9, [V]-17, [W]-3 and [W]-4 obtained in Example 3 were imagewise exposed to light for one minute using a PS Light (available from Fuji Photo Film Co., Ltd.) disposed at a distance of 1 m therefrom, immersed in either of the foregoing developers [T] and [U] for 50 seconds and then the surface thereof was lightly rubbed with a brush to remove the unexposed portions.

Each lithographic printing plate thus obtained was set up on GTO printing press (available from Heidelberg Co., Ltd.) and printing was performed using wood-free paper and commercially available oil ink to determine the possible number of printed matter in good quality for each of the printing plates, [V]-9, [V]-17, [W]-3 and [W]-4. The results are shown in Table 6. As seen from the results of Table 6, the PS plates [V]-9 and [V]-17 utilizing the light-sensitive composition of the invention exhibited higher copy numbers of printed matter than the comparative PS plates [W]-3 and [W]-4, and this means that the light-sensitive composition of the invention provided higher printing durability as compared with the comparative light-sensitive composition.

TABLE 6

| PS plate | Developer | Copy Number of Printed Matter |
|---|---|---|
| [V]-9 | [T] | 48,000 |
| [V]-9 | [U] | 50,000 |
| [V]-17 | [T] | 43,000 |
| [V]-17 | [U] | 42,000 |
| Comparative Examples | | |
| [W]-3 | [T] | 36,000 |
| [W]-3 | [U] | 37,000 |
| [W]-4 | [T] | 32,000 |

TABLE 6-continued

| PS plate | Developer | Copy Number of Printed Matter |
|---|---|---|
| [W]-4 | [U] | 33,000 |

What is claimed is:

1. A light-sensitive composition comprising a photo-crosslinkable polymer compound wherein the photo-crosslinkable polymer compound comprises structural units respresented by the following formula (I) in an amount of not less than 1% by weight on the basis of the total weight of the photo-crosslinkable polymer compound;

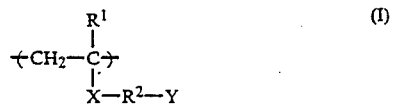

wherein $R^1$ represents a hydrogen atom or methyl group; X represents a single bond, an ester bond or an amide bond; $R^2$ represents a single bond or a divalent bridging group composed of two or more kinds of atoms selected from the group consisting of C, H, N, O and S; and Y represents a polymer group having a weight average molecular weight of not less than 500 and comprising structural units represented by the following formula (II) in an amount of not less than 5% by weight on the basis of the total weight of the group Y;

where $R^3$ represents a hydrogen atom or methyl group; $R^4$ represents a single bond or a divalent bridging group composed of two or more kinds of atoms selected from the group consisting of C, H, N, O and S; and Z represents a functional group represented by the following formula (III) [or (IV)];

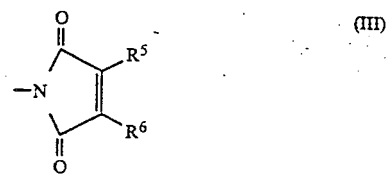

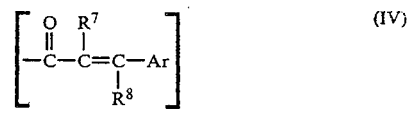

2. The light-sensitive composition of claim 1, wherein the photo-crosslinkable polymer compound is obtained by radical polymerization of macromers represented by the following formula (V) and addition-polymerizable monomers other than the macromers of the formula (V);

wherein R¹, R², X and Y have the same meanings as those defined in claim 1.

3. The light-sensitive composition of claim 2, wherein the group Y is a polymer group obtained by radical polymerization of addition-polymerizable monomers represented by the following formula (VI);

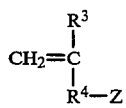
(VI)

wherein R³, R⁴ and Z have the same meanings as those defined in claim 1.

4. The light-sensitive composition of claim 3, wherein the group Y is a polymer group obtained by radical polymerization of monomers of the formula (VI) and addition-polymerizable monomers other than those of formula (VI) selected from the group consisting of acrylates, methacrylates, acrylamides, methacrylamides, allyl compounds, vinyl ethers, vinyl esters, styrenes and crotonates.

5. The light-sensitive composition of claim 2, wherein the addition-polymerizable monomers other than the macromers of the formula (V) are selected from monomers having an acid group selected from the group consisting of —COOH, —OPO(OH)(OR¹⁵), —PO(OH)(OR¹⁶), —SO₃H and —CONHSO₂R¹⁷, where R¹⁵ and R¹⁶ independently represent hydrogen atom or an optionally substituted alkyl group having 1 to 15 carbon atoms and R¹⁷ represents an optionally substituted hydrocarbon group having 1 to 15 carbon atoms.

6. The light-sensitive composition of claim 5, wherein the monomers having the acid group are selected from the following compounds;

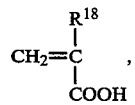

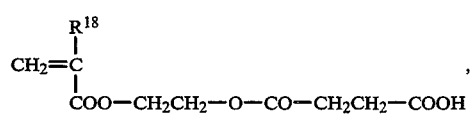

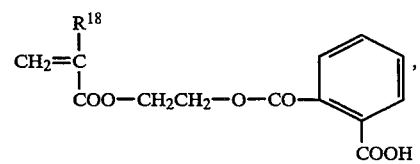

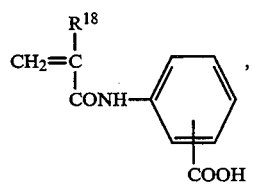

-continued

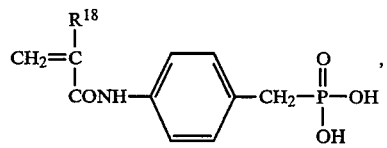

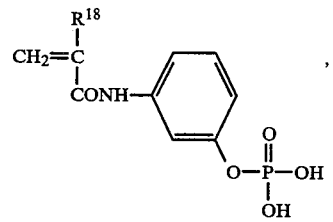

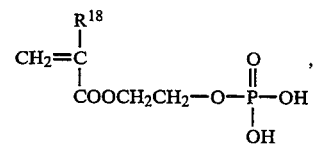

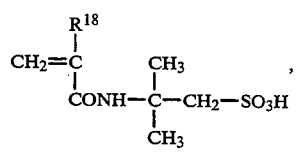

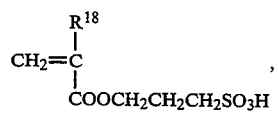

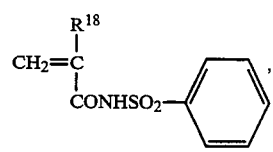

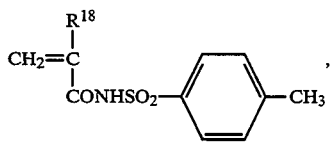

and

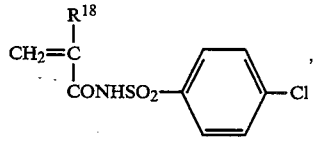

wherein R¹⁸ represents hydrogen atom or methyl group.

7. The light-sensitive composition of claim 5, wherein the addition-polymerizable monomers further comprise one or more kinds of monomers other than the macromers of the formula (V) arid the monomers having the acid group, which are selected from the group consisting of acrylates, methacrylates, acrylamides, methacrylamides, acrylonitrile, methacrylonitrile and the compounds of the formula (VI) defined in claim 3.

8. The light-sensitive composition of claim 1, wherein the photo-crosslinkable polymer compound has an average molecular weight of from 5,000 to 300,000, a number average molecular weight of from 1,000 to 250,000 and a polydispersity of from 1.1 to 10.

9. The light-sensitive composition of claim 1 which comprises a triplet sensitizer having a maximum absorption at a wavelength of not less than 300 nm in an amount of from 1 to 20% by weight on the basis of the total weight of the composition.

10. A light-sensitive composition comprising a photo-crosslinkable polymer compound wherein the photo-crosslinkable polymer compound comprises structural units represented by the following formula (VII);

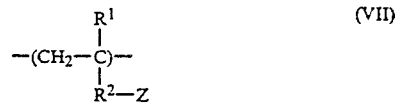

(VII)

wherein $R^1$ represents it hydrogen atom or methyl group; $R^2$ represents a single bond or a divalent bridging group composed of two or more kinds of atoms selected from the group consisting of C, H, N, O and S; and Z represents a functional group of the following formula (III);
wherein $R^1$ and $R^6$ independently represent a hydrogen atom, a halogen atom or an alkyl group having 1 to 12 carbon atoms, or $R^5$ and $R^6$ may combine to form a 5- or 6-membered ring;

and structural units represented by the following formula (VIII):

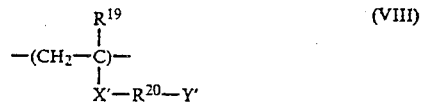

(VIII)

wherein $R^{19}$ represents a hydrogen atom or methyl group; X' represents a single bond, an ester bond or an amide bond; $R^{20}$ represents a single bond or a divalent bridging group composed of two or more kinds of atoms selected from the group consisting of C, H, N, O and S; Y' represents a polymer group having a weight average molecular weight of not less than 500 and comprising structural units represented by the following formula (IX) in an amount of not less than 5% by weight on the basis of the total weight of the group Y';

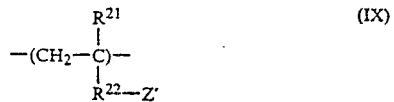

(IX)

where $R^{21}$ represents a hydrogen atom or methyl group; $R^{22}$ represents a single bond or a divalent bridging group composed of two or more kinds of atoms selected from the group consisting of C, H, N, O and S; and Z' represents —COOH, —OPO(OH)($OR^{15}$), —PO(OH)($OR^{16}$), —$SO_3H$ or —$CONHSO_2R^{17}$, where $R^{15}$ and $R^{16}$ independently represent a hydrogen atom or an optionally substituted alkyl group having 1 to 15 carbon atoms; and $R^{17}$ represents an optionally substituted hydrocarbon group having 1 to 15 carbon atoms.

11. The light-sensitive composition of claim 10, wherein the photo-crosslinkable polymer compound is obtained by radical polymerization of monomers represented by the formulae (X) and macromers represented by the formula (XI);

(X)

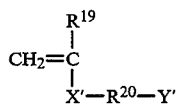

(XI)

wherein $R^1$, $R^2$, Z, $R^{19}$, $R^{20}$, X' and Y' have the same meanings as those defined in claim 10.

12. The light-sensitive composition of claim 10, wherein the structural units of the formula (IX) are selected from the following units;

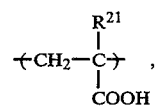

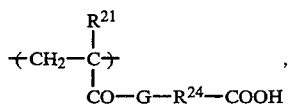

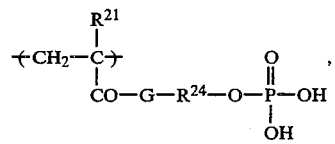

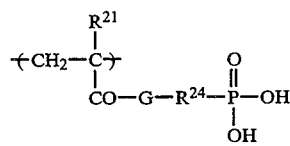

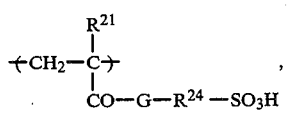

and

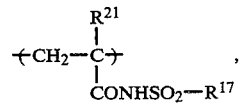

wherein $R^{21}$ and $R^{17}$ has the same meanings as those defined in claim 10; G represents —O— or —NH—; $R^{24}$ represents an optional substituted hydrocarbon bridging group having 1 to 15 carbon atoms.

13. The light-sensitive composition of claim 12, wherein the structural units of the formula (IX) are selected from the following units;

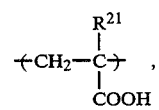

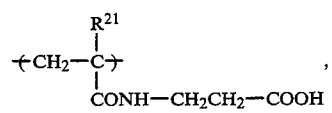

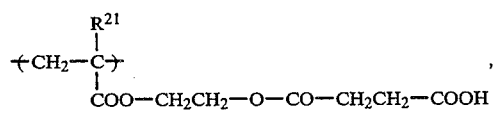

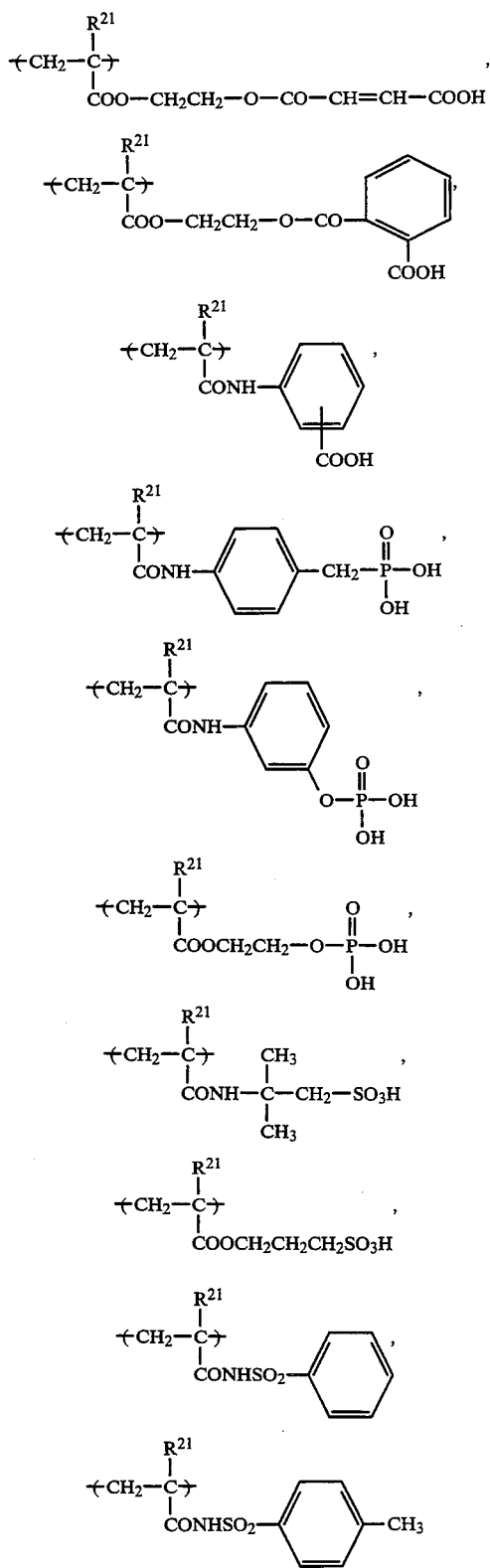

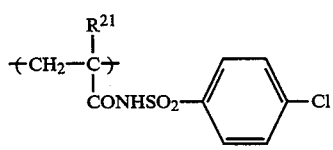

wherein $R^{21}$ represents hydrogen atom or methyl group.

14. The light-sensitive composition of claim 10, wherein the group Y' comprises structural units other than those of the formula (IX), which are derived from monomers selected from the group consisting of acrylates, methacrylates, acrylamides, methacrylamides, allyl compounds, vinyl ethers, vinyl esters, styrenes and crotonares.

15. The light-sensitive composition of claim 10, wherein the group Y' comprises structural units derived from the monomers of the formula (X) defined in claim 11.

16. The light-sensitive composition of claim 10, wherein the group Y' in the formula (VIII) comprises the structural units of the formula (IX) in an amount of from 20 to 100% by weight on the basis of the total weight of the group Y'.

17. The light-sensitive composition of claim 11, wherein the photo-crosslinkable polymer compound comprises structural units other than those derived from the monomers of the formulae (X) and (XI) and selected from the group consisting of acrylates, methacrylates, acrylamides, methacrylamides, acrylonitrile and methacrylonitrile.

18. The light-sensitive composition of claim 10, wherein the photo-crosslinkable polymer compound has an average molecular weight of from 5,000 to 300,000, a number average molecular weight of from 1,000 to 250,000 and a polydispersity of from 1.1 to 10.

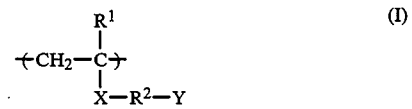  (I)

  (II)

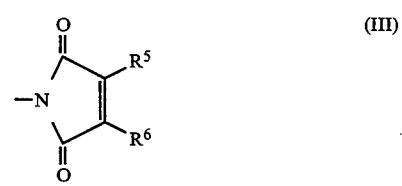  (III)

  (VII)

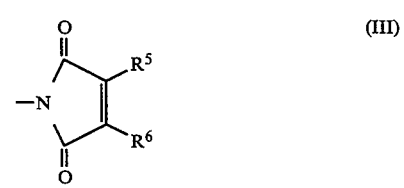  (III)

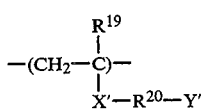 (VIII)

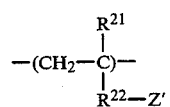 (IX)

19. The light-sensitive composition of claim 3, wherein the addition-polymerizable monomers of the formula (VI) are selected from the following compounds;

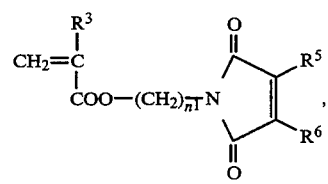

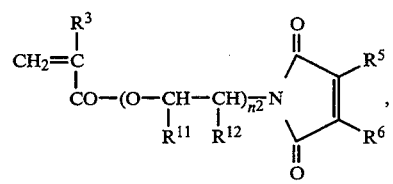

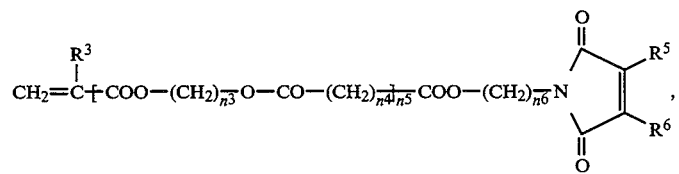

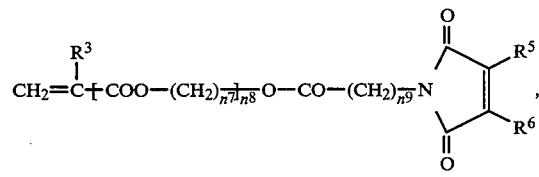

and

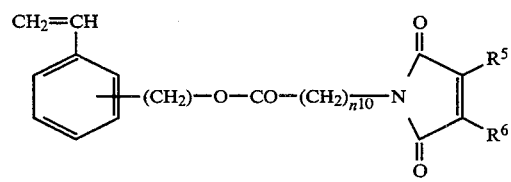

wherein each of $n^1$-$n^{10}$ is a positive integer.

20. The light-sensitive composition of claim 11, wherein the monomers of formula (X) are selected from the following compounds;

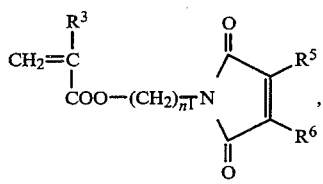

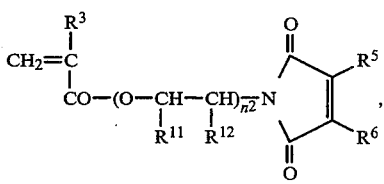

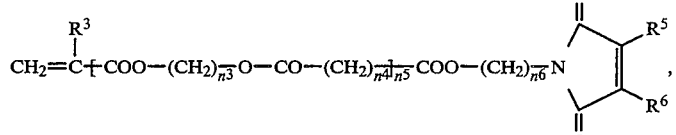

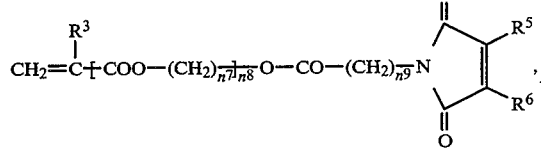

and

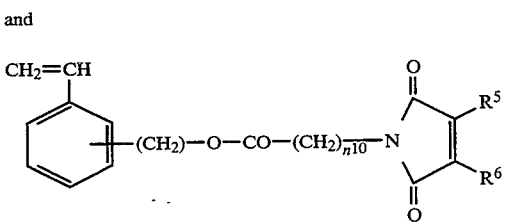

wherein each of $n^1$-$n^{10}$ is a positive integer.

* * * * *